US010673205B2

United States Patent
Nishita et al.

(10) Patent No.: US 10,673,205 B2
(45) Date of Patent: *Jun. 2, 2020

(54) WAVELENGTH TUNABLE LASER MODULE AND METHOD OF CONTROLLING WAVELENGTH THEREOF

(71) Applicant: FURUKAWA ELECTRIC CO., LTD., Tokyo (JP)

(72) Inventors: Masayoshi Nishita, Tokyo (JP); Kengo Muranushi, Tokyo (JP); Atsushi Yamamoto, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/359,586

(22) Filed: Mar. 20, 2019

(65) Prior Publication Data
US 2019/0221998 A1 Jul. 18, 2019

Related U.S. Application Data

(63) Continuation-in-part of application No. 15/432,290, filed on Feb. 14, 2017, now Pat. No. 10,270,533.

(30) Foreign Application Priority Data

Feb. 15, 2016 (JP) .................................. 2016-025479

(51) Int. Cl.
*H04B 10/572* (2013.01)
*H01S 5/0625* (2006.01)
(Continued)

(52) U.S. Cl.
CPC .......... *H01S 5/06258* (2013.01); *H01S 5/068* (2013.01); *H01S 5/0617* (2013.01);
(Continued)

(58) Field of Classification Search
None
See application file for complete search history.

(56) References Cited

U.S. PATENT DOCUMENTS 6,349,103 B1 * 2/2002 Chung .................. H01S 5/0687
372/20
6,396,603 B1 * 5/2002 Kim ...................... H04B 10/504
398/192

(Continued)

FOREIGN PATENT DOCUMENTS

JP 2012-33895 2/2012
JP 2014-45172 A 3/2014

(Continued)

OTHER PUBLICATIONS

Notice of Reasons for Refusal dated Nov. 5, 2019 in corresponding Japanese Patent Application No. 2016-025479 (with English machine translation)(8 pages).

*Primary Examiner* — Li Liu
(74) *Attorney, Agent, or Firm* — Oblon, McClelland, Maier & Neustadt, L.L.P.

(57) ABSTRACT

A method of controlling a wavelength of a wavelength tunable laser module includes: referring to data of measured frequencies and wavelength filter control values at two or more points for each basic frequency channel, the data being stored in a memory of a controller; selecting the basic frequency channel closest to a frequency of laser light that a laser light source is instructed to emit; calculating a first wavelength filter control value for providing the instructed frequency of laser light from the data of the measured frequencies allocated to the basic frequency channel closest to the instructed frequency and the wavelength filter control values; and controlling the transmission characteristic of a wavelength filter using the first wavelength filter control value.

10 Claims, 13 Drawing Sheets

(51) Int. Cl.
*H01S 5/06* (2006.01)
*H01S 5/068* (2006.01)
*H01S 5/0687* (2006.01)
*H01S 5/40* (2006.01)
*H04J 14/02* (2006.01)
*H01S 5/12* (2006.01)
*H01S 5/026* (2006.01)
*H01S 5/024* (2006.01)
*H01S 5/0683* (2006.01)
*H01S 5/022* (2006.01)

(52) U.S. Cl.
CPC ........ *H01S 5/0687* (2013.01); *H01S 5/06804* (2013.01); *H01S 5/4087* (2013.01); *H04B 10/572* (2013.01); *H04J 14/0224* (2013.01); *H04J 14/0226* (2013.01); *H04J 14/0227* (2013.01); *H01S 5/026* (2013.01); *H01S 5/0265* (2013.01); *H01S 5/02248* (2013.01); *H01S 5/02415* (2013.01); *H01S 5/0683* (2013.01); *H01S 5/12* (2013.01); *H01S 5/4012* (2013.01)

(56) References Cited

U.S. PATENT DOCUMENTS

| | | | | |
|---|---|---|---|---|
| 6,782,017 B1* | 8/2004 | Kai | ............ | H01S 5/0687 359/247 |
| 2002/0041414 A1* | 4/2002 | Oguma | ............ | H04B 10/07957 398/87 |
| 2002/0048063 A1* | 4/2002 | Jung | ............ | H04B 10/506 398/95 |
| 2002/0057476 A1* | 5/2002 | Yamane | ............ | H04B 10/2942 398/82 |
| 2002/0076132 A1* | 6/2002 | Peral | ............ | H04B 10/25133 385/15 |
| 2002/0088920 A1* | 7/2002 | Imajuku | ............ | G01J 9/00 250/201.1 |
| 2003/0076568 A1* | 4/2003 | Wu | ............ | H04B 10/504 398/197 |
| 2003/0112836 A1* | 6/2003 | Kim | ............ | H01S 5/0687 372/18 |
| 2003/0174743 A1* | 9/2003 | Cliche | ............ | H04B 10/504 372/20 |
| 2003/0179790 A1* | 9/2003 | Bouda | ............ | H01S 3/1068 372/20 |
| 2004/0008995 A1* | 1/2004 | Ono | ............ | H04B 10/564 398/182 |
| 2004/0101006 A1* | 5/2004 | Iwafuji | ............ | H01S 5/02252 372/36 |
| 2004/0114938 A1* | 6/2004 | Nering | ............ | H04B 10/572 398/149 |
| 2004/0208428 A1* | 10/2004 | Kikuchi | ............ | G02B 6/29358 385/24 |
| 2005/0265725 A1* | 12/2005 | Okano | ............ | H04B 10/25133 398/147 |
| 2006/0145051 A1* | 7/2006 | Kawai | ............ | H01S 5/068 250/201.1 |
| 2009/0003843 A1* | 1/2009 | Oomori | ............ | H01S 5/0622 398/197 |
| 2011/0052207 A1* | 3/2011 | Ishikawa | ............ | H01S 5/0687 398/182 |
| 2011/0085794 A1* | 4/2011 | Lei | ............ | H04B 10/506 398/25 |
| 2012/0170937 A1* | 7/2012 | Van Leeuwen | .. | H04B 10/07957 398/76 |
| 2012/0195593 A1* | 8/2012 | Bernasconi | ............ | H04B 10/506 398/48 |
| 2013/0084073 A1* | 4/2013 | Shen | ............ | H04J 14/02 398/95 |
| 2014/0036940 A1 | 2/2014 | Tanaka et al. | | |
| 2015/0076990 A1 | 3/2015 | Uesaka et al. | | |
| 2015/0117478 A1 | 4/2015 | Banno | | |
| 2016/0112140 A1* | 4/2016 | Rahn | ............ | H04B 10/0775 398/79 |
| 2016/0112141 A1* | 4/2016 | Rahn | ............ | H04J 14/0256 398/79 |

FOREIGN PATENT DOCUMENTS

JP       2015-60961 A     3/2015
JP       2015-88626 A     5/2015

\* cited by examiner

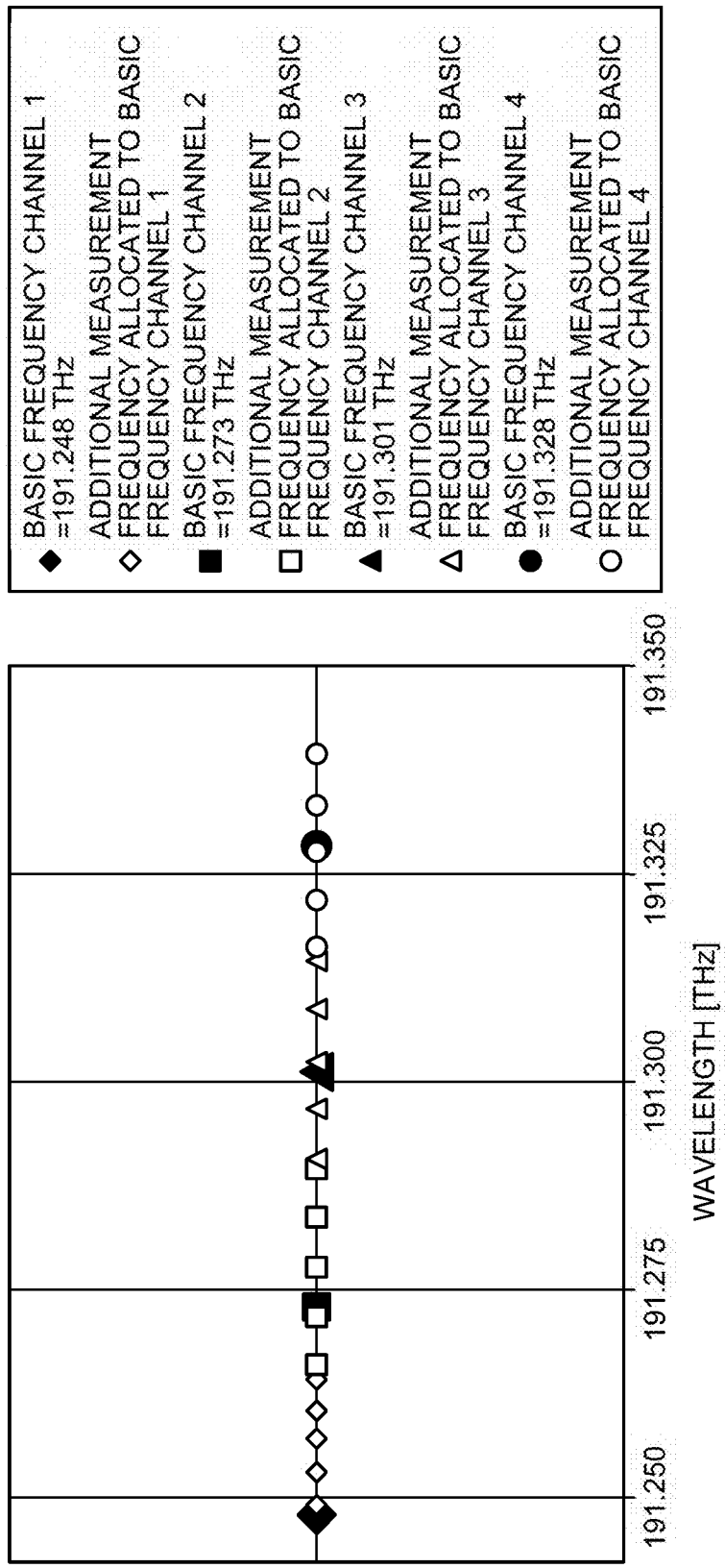

WAVELENGTH TUNABLE LASER MODULE AND METHOD OF CONTROLLING WAVELENGTH THEREOF

CROSS-REFERENCE TO RELATED APPLICATIONS

The present application is a continuation-in-part of U.S. application Ser. No. 15/432,290 filed Feb. 14, 2017, which claims priority to Japanese Patent Application No. 2016-025479 filed on Feb. 15, 2016, entire contents of which are incorporated herein by reference.

BACKGROUND

The present disclosure relates to a wavelength tunable laser module and a method of controlling a wavelength of the wavelength tunable laser module.

With an increase in amount of information communication, optical signals are demanded to be multiplexed with narrower wavelength spacing in a wavelength division multiplexing (WDM) communication field in which a plurality of optical signals having different wavelengths are multiplexed and transmitted simultaneously in a single optical fiber. For multiplexing the optical signals with narrower wavelength spacing, it is necessary to highly accurately control a wavelength of laser light emitted from a laser element as a signal.

In recent years, what is called a flexible grid method is introduced into the frequency spacing of laser light to efficiently use an optical transmission wavelength bandwidth instead of a common fixed grid method in which the frequency spacing is fixed to 25 GHz or 50 GHz. The flexible gird method allows wavelengths to be arranged randomly with different frequency spacing.

It has been examined to utilize a semiconductor laser module using an etalon filter for communication employing the flexible grid method. The etalon filter has a wavelength transmission characteristic changeable by controlling a temperature thereof. The semiconductor laser module using the etalon filter splits a part of laser light emitted from a semiconductor laser element to the etalon filter and controls a temperature of the semiconductor laser element on the basis of power of the split light transmitted by the etalon filter, thereby controlling the wavelength of laser light emitted from the semiconductor laser element. The etalon filter has a periodic wavelength transmission characteristic. The periodic wavelength transmission characteristic is shifted in a wavelength direction depending on the temperature of the etalon filter. As a result, the semiconductor laser module using the etalon filter may control laser light emitted therefrom such that laser light has desirable wavelength and power. For example, refer to Japanese Patent Application Laid-open No. 2012-33895.

When the flexible grid method is achieved on the basis of the extension of the related technique, the flexible grid method has a limit. For example, when the whole of C-band is covered by channels based on a common frequency grid with 50 GHz spacing, the number of channels is approximately 100. When the related technique is simply extended to a frequency grid with spacing of 0.1 GHz, which is an example of the grid spacing of the wavelength tunable laser module for providing the flexible grid method, the number of channels is approximately 50,000, which is 500 times of that of the 50 GHz grid. It is, however, not practical, from mass production and cost viewpoints, that calibration is performed on all of the approximately 50,000 channels and laser driving conditions and control target values as the results of the calibration are stored in a memory.

SUMMARY

The present disclosure is directed to a method of controlling a wavelength of the wavelength tunable laser module.

According to a first aspect of the present disclosure, there is provided a method of controlling a wavelength of a wavelength tunable laser module that includes a laser light source that emits laser light, a wavelength filter having a periodic transmission characteristic with respect to a wavelength of light, and a controller that controls a wavelength of laser light emitted from the laser light source based on power of the laser light transmitted by the wavelength filter and controls the transmission characteristic of the wavelength filter. The method includes referring to data of measured frequencies and wavelength filter control values at two or more points for each basic frequency channel, the data being stored in a memory of the controller; selecting the basic frequency channel closest to a frequency of laser light that the laser light source is instructed to emit from a plurality of the basic frequency channels stored in the memory; calculating a first wavelength filter control value to provide the instructed frequency of laser light from the data of the measured frequencies allocated to the basic frequency channel closest to the instructed frequency and the wavelength filter control values; and controlling the transmission characteristic of the wavelength filter using the first wavelength filter control value, wherein the first wavelength filter control value is a temperature of the wavelength filter.

According to a second aspect of the present disclosure, there is provided a wavelength tunable laser module that includes a laser light source that emits laser light; a wavelength filter that has a periodic transmission characteristic with respect to a wavelength of light; a controller that controls a wavelength of laser light emitted from the laser light source based on power of the laser light transmitted by the wavelength filter and controls the transmission characteristic of the wavelength filter, wherein the controller includes a computing unit that is programmed so as to execute referring to data of measured frequencies and wavelength filter control values at two or more points for each basic frequency channel, the data being stored in a memory of the controller; selecting the basic frequency channel closest to a frequency of laser light that the laser light source is instructed to emit from a plurality of the basic frequency channels stored in the memory; calculating a first wavelength filter control value to provide the instructed frequency of laser light from the data of the measured frequencies allocated to the basic frequency channel closest to the instructed frequency and the wavelength filter control values; and controlling the transmission characteristic of the wavelength filter using the first wavelength filter control value, and wherein the first wavelength filter control value is a temperature of the wavelength filter.

According to a third aspect of the present disclosure, there is provided a method of controlling a wavelength of a wavelength tunable laser module that includes a laser light source that emits laser light, a wavelength filter having a periodic transmission characteristic with respect to a wavelength of light, and a controller that controls a wavelength of laser light emitted from the laser light source based on power of the laser light transmitted by the wavelength filter and controls the transmission characteristic of the wavelength filter. The method includes referring to data of measured frequencies and wavelength filter control values at two or more points for each basic frequency channel, the data being stored in a memory of the controller; selecting the basic frequency channel closest to a frequency of laser light that the laser light source is instructed to emit from a plurality of the basic frequency channels stored in the memory; calculating a first wavelength filter control value to provide the instructed frequency of laser light from the data of the measured frequencies allocated to the basic frequency channel closest to the instructed frequency and the wavelength filter control values; selecting the basic frequency channel secondly closest to the frequency of laser light that the laser light source is instructed to emit from the plurality of the basic frequency channels stored in the memory; calculating a second wavelength filter control value for providing the instructed frequency of laser light from the data of the measured frequencies allocated to the basic frequency channel secondly closest to the instructed frequency and the wavelength filter control values; and controlling the transmission characteristic of the wavelength filter using one closer to a center value of the wavelength filter control value stored in the memory out of the first wavelength control value and the second wavelength control value instead of the first wavelength control value, wherein the first wavelength filter control value is a temperature of the wavelength filter.

According to a fourth aspect of the present disclosure, there is provided a wavelength tunable laser module including a laser light source that emits laser light; a wavelength filter that has a periodic transmission characteristic with respect to a wavelength of light; a controller that controls a wavelength of laser light emitted from the laser light source base on power of the laser light transmitted by the wavelength filter and controls the transmission characteristic of the wavelength filter, wherein the controller includes a computing unit that is programmed so as to execute referring to data of measured frequencies and wavelength filter control values at two or more points for each basic frequency channel, the data being stored in a memory of the controller; selecting the basic frequency channel closest to a frequency of the laser light that the laser light source is instructed to emit from a plurality of the basic frequency channels stored in the memory; calculating a first wavelength filter control value to provide the instructed frequency of laser light from the data of the measured frequencies allocated to the basic frequency channel closest to the instructed frequency and the wavelength filter control values; selecting the basic frequency channel secondly closest to the frequency of laser light that the laser light source is instructed to emit from the plurality of the basic frequency channels stored in the memory; calculating a second wavelength filter control value to provide the instructed frequency of laser light from the data of the measured frequencies allocated to the basic frequency channel secondly closest to the instructed frequency and the wavelength filter control values; and controlling the transmission characteristic of the wavelength filter using one closer to a center value of the wavelength filter control value stored in the memory out of the first wavelength control value and the second wavelength control value instead of the first wavelength control value, wherein the first wavelength filter control value is a temperature of the wavelength filter.

The above and other objects, features, advantages and technical and industrial significance of this disclosure will be better understood by reading the following detailed description of presently preferred embodiments of the disclosure, when considered in connection with the accompanying drawings.

BRIEF DESCRIPTION OF THE DRAWINGS

FIG. 4B is a schematic diagram illustrating a relation between basic frequency channels and additional measurement frequencies;

DETAILED DESCRIPTION

Figure 1:
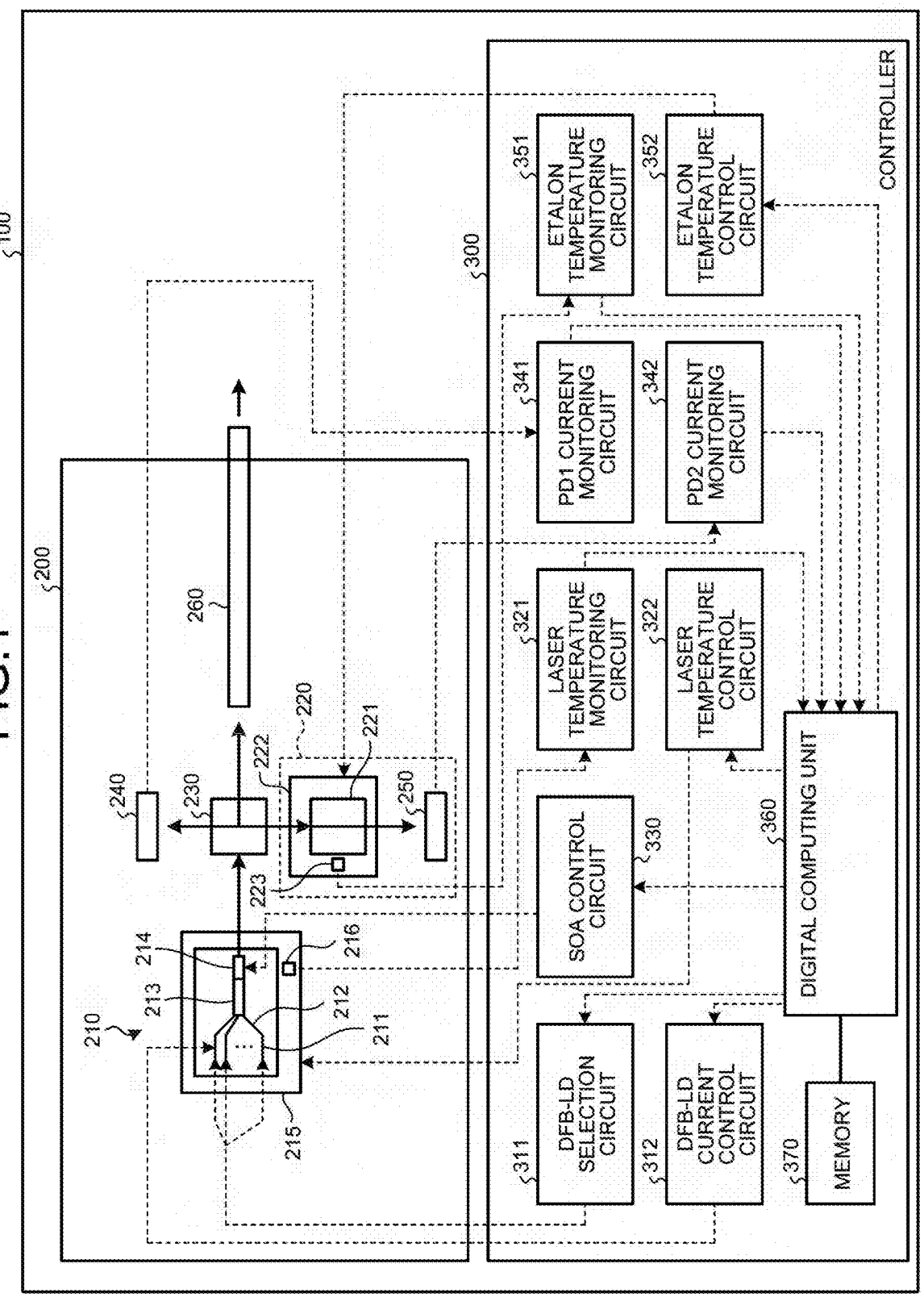
FIG. 1 is a schematic diagram illustrating an exemplary structure of a wavelength tunable laser module according to a first embodiment.

The following describes a method of controlling a wavelength of a wavelength tunable laser module according to embodiments of the disclosure in detail with reference to the accompanying drawings. The flowing embodiments do not limit the disclosure. In the drawings, the same or corresponding components are labeled with the same reference numerals. The drawings are schematic and thus it is noted that thicknesses of respective layers and ratios between the thicknesses of the respective layers differ from those of the actual components. Furthermore, the relation and ratios between dimensions of the respective components may differ from one another among the drawings.

First Embodiment

FIG. 1 is a schematic diagram illustrating an exemplary structure of a wavelength tunable laser module according to a first embodiment. The wavelength tunable laser module illustrated in FIG. 1 is a typical example of an apparatus used for performing the method of controlling the wavelength of the wavelength tunable laser module according to the first embodiment.

As illustrated in FIG. 1, this wavelength tunable laser module 100 includes a wavelength tunable light source unit 200 and a controller 300 as major components. The wavelength tunable light source unit 200 outputs laser light having desired wavelength and power in accordance with control from the controller 300, and supplies the laser light to an apparatus in a following stage. The controller 300 is connected to a higher-level controller provided with a user interface, for example. The controller 300 controls the wavelength tunable light source unit 200 in accordance with the user's instruction via the higher-level controller. The wavelength tunable laser module 100 may include the wavelength tunable light source unit 200 and the controller 300 individually or by assembling them on a circuit substrate together.

As illustrated in FIG. 1, the wavelength tunable light source unit 200 includes a laser light source 210, a wavelength detector 220, an optical demultiplexer 230, a power monitor 240, and an optical fiber 260.

The laser light source 210 includes distributed feedback laser diodes (DFB-LDs) 211, an optical waveguide 212, an optical multiplexer 213, a semiconductor optical amplifier (SOA) 214, a Peltier element 215, and a laser temperature monitoring element 216. The DFB-LDs 211, the optical waveguide 212, the optical multiplexer 213, and the SOA 214 may be formed on a single semiconductor chip.

The laser light source 210 includes a plurality of DFB-LDs 211 that are arranged in a stripe shape and emit laser light having wavelengths different from one another from respective front facets thereof. An emission wavelength of each DFB-LD 211 may be controlled by adjusting the temperature of the DFB-LD 211. The respective DFB-LDs 211 are placed on the Peltier element 215. The temperature of the DFB-LD 211 may be changed by the Peltier element 215. The laser temperature monitoring element 216 is provided on the Peltier element 215, thereby making it possible to monitor the temperature of the DFB-LD 211.

The emission wavelength of the DFB-LD is changeable in an approximate range from 3 nm to 4 nm. The emission wavelengths of the respective DFB-LDs 211 are designed such that the emission wavelengths of the DFB-LDs 211 have spacing of an approximate range from 3 nm to 4 nm therebetween. The laser light source 210 selects and drives one suitable for obtaining a desired wavelength of laser light out of the multiple DFB-LDs 211, and controls the temperature of the selected DFB-LD 211, thereby making it possible to emit laser light over a continuous wavelength bandwidth wider than that of a single DFB-LD.

In order to cover the whole wavelength bandwidth for WDM communication (e.g., C-band (1.53 μm to 1.56 μm) or L-band (1.57 μm to 1.61 μm)), 12 DFB-LDs 211 are integrated each of which is capable of changing its emission wavelength in a range from 3 nm to 4 nm, for example. As a result, the wavelength of laser light is changeable over a wavelength bandwidth equal to or larger than 30 nm.

Laser light emitted from any of the DFB-LDs 211, travels the optical waveguide 212 and the optical multiplexer 213, thereafter, is guided to one optical path, amplified by the SOA 214, and emitted from the laser light source 210.

The optical demultiplexer 230 is optically coupled to the optical fiber 260 so as to output, from the wavelength tunable light source unit 200, most of laser light output from the laser light source 210. Simultaneously, the optical demultiplexer 230 splits a part of laser light output from the laser light source 210 into the power monitor 240 and the wavelength detector 220 to supply the split light to the power monitor 240 and the wavelength detector 220. The optical fiber 260 outputs the laser light received from the optical demultiplexer 230 to supply the received light to the apparatus in the following stage (not illustrated).

The power monitor 240 is a measuring instrument using a photo diode that outputs an electrical signal according to intensity (power) of received light. The electrical signal output from the power monitor 240, thus, may be converted into the power of laser light output from the optical fiber 260.

Figure 2:
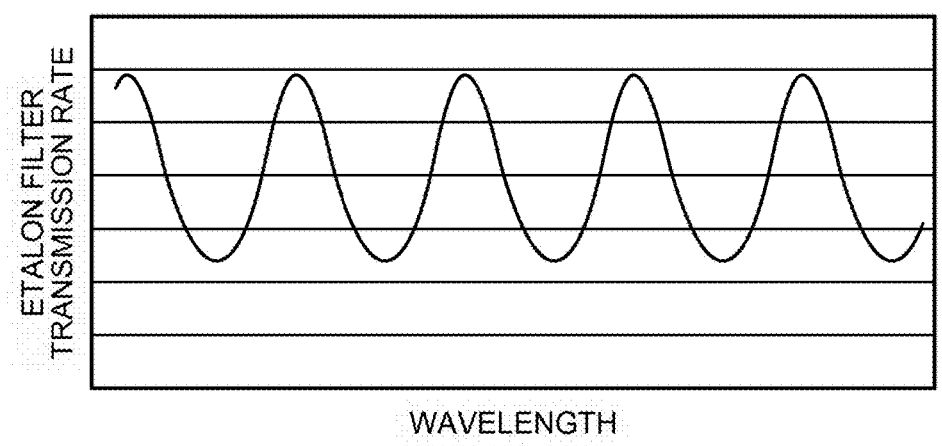
FIG. 2 is a graph illustrating an exemplary periodic transmission characteristic of a wavelength filter.

The wavelength detector 220 includes a wavelength filter 221, a Peltier element 222, a filter temperature monitoring element 223, and a wavelength monitor 250. The wavelength filter 221 has a periodic transmission characteristic with respect to the wavelength of light. An etalon filter is used for the wavelength filter 221, for example. FIG. 2 is a graph illustrating an exemplary periodic transmission characteristic of the wavelength filter.

The periodic wavelength transmission characteristic of the wavelength filter 221 is shifted in a wavelength direction depending on the temperature of the wavelength filter 221. A temperature coefficient of the shifting differs from material to material forming the wavelength filter 221. The temperature characteristic of the etalon filter formed by quartz ($SiO_2$) is approximately 1.25 GHz/° C. The temperature characteristic of the etalon filter formed by crystal is approximately 1.9 GHz/° C. The temperature characteristic of the etalon filter formed by bismuth germanium oxide ($Bi_{12}GeO_{20}$:BGO) is approximately 2.5 GHz/° C.

When the temperature characteristic of the etalon filter is too large, the transmission characteristic of the etalon filter becomes sensitive to a change in temperature. As a result, the transmission characteristic of the etalon filter easily varies. In contrast, when the temperature characteristic of the etalon filter is too small, the temperature of the etalon filter needs to be largely shifted in controlling output of a use frequency other than a basic frequency channel. As a result, power consumption is increased.

The wavelength filter 221 is placed on the Peltier element 222. The temperature of the wavelength filter 221 may be changed by the Peltier element 222. The filter temperature monitoring element 223 is provided on the Peltier element 222, thereby making it possible to monitor the temperature of the wavelength filter 221.

Laser light split by the optical demultiplexer 230 is transmitted by the wavelength filter 221 of the wavelength detector 220 and incident on the wavelength monitor 250. The wavelength monitor 250 is a measuring instrument using a photo diode that outputs an electrical signal according to intensity (power) of received light in the same manner as the power monitor 240. The electrical signal output from the wavelength monitor 250 is a result of multiplying the power of laser light that is output from the laser light source 210, split by the optical demultiplexer 230, and incident on the wavelength filter 221 by the transmission characteristic illustrated in FIG. 2.

Figure 3:
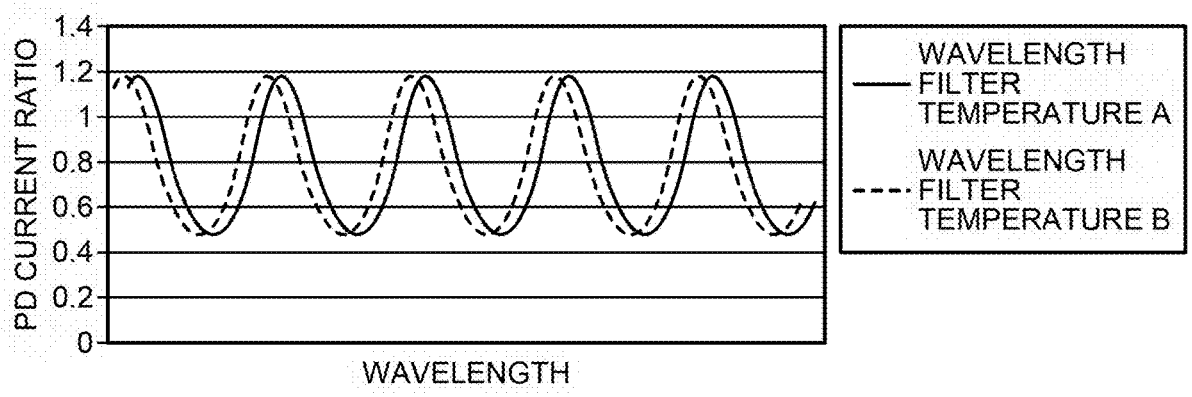
FIG. 3 is a graph illustrating exemplary PD current ratios at two wavelength filter temperatures.

As described above, the wavelength filter 221 has a periodic transmission characteristic with respect to the wavelength of light. Let a ratio of the electrical signal (PD2) output from the wavelength monitor 250 to the electrical signal (PD1) output from the power monitor 240 be a PD current ratio. The PD current ratio (PD2/PD1) also has a periodic value with respect to the wavelength of light. The periodic wavelength transmission characteristic of the wavelength filter 221 is shifted in the wavelength direction depending on the temperature of the wavelength filter 221. FIG. 3 is a graph illustrating exemplary PD current ratios at two temperatures of the wavelength filter 221.

The curves in the graph illustrated in FIG. 3, which are called discrimination curves, each illustrate a relation between the measured PD current ratio and the wavelength of output laser light. When the PD current ratio is monitored using such a discrimination curve illustrated in FIG. 3, an error in the wavelength of laser light output from the laser light source 210 may be detected. The discrimination curve of the wavelength filter 221 may be shifted in the wavelength direction by controlling the temperature of the wavelength filter 221. The discrimination curve, thus, may be obtained that corresponds to a desired wavelength of laser light to be output from the laser light source 210.

The following describes a structure of the controller 300. The structure of the controller 300 illustrated in FIG. 1 illustrates functions as blocks. The blocks illustrated in FIG. 1 are, however, not physically separated from one another.

As illustrated in FIG. 1, the controller 300 includes a DFB-LD selection circuit 311, a DFB-LD current control circuit 312, a laser temperature monitoring circuit 321, a laser temperature control circuit 322, an SOA control circuit 330, a PD1 current monitoring circuit 341, a PD2 current monitoring circuit 342, an etalon temperature monitoring circuit 351, an etalon temperature control circuit 352, a digital computing unit 360, and a memory 370.

The DFB-LD selection circuit 311 selects one of the DFB-LDs 211 in accordance with an instruction from the digital computing unit 360. Specifically, the selection may be achieved by switching switches of circuits each supplying a current to the corresponding DFB-LD 211. The DFB-LD current control circuit 312 controls the current supplied to the DFB-LD 211 in accordance with an instruction from the digital computing unit 360.

The laser temperature monitoring circuit 321 detects the temperature of the laser temperature monitoring element 216 to identify the temperature of the DFB-LD 211, and transmits the temperature of the DFB-LD 211 to the digital computing unit 360 as a digital signal. The laser temperature control circuit 322 controls a current supplied to the Peltier element 215 such that the temperature of the DFB-LD 211 becomes the temperature instructed from the digital computing unit 360.

The SOA control circuit 330 controls a current supplied to the SOA 214 to adjust a gain of the SOA 214 in accordance with an instruction from the digital computing unit 360.

The PD1 current monitoring circuit 341 converts the current output from the power monitor 240 into a digital signal and transmits the digital signal to the digital computing unit 360. The PD2 current monitoring circuit 342 converts the current output from the wavelength monitor 250 into a digital signal and transmits the digital signal to the digital computing unit 360.

The etalon temperature monitoring circuit 351 detects the temperature of the filter temperature monitoring element 223 to identify the temperature of the wavelength filter 221, and transmits the temperature of the wavelength filter 221 to the digital computing unit 360 as a digital signal. The etalon temperature control circuit 352 controls a current supplied to the Peltier element 222 such that the temperature of the wavelength filter 221 becomes the temperature instructed from the digital computing unit 360.

The memory 370 stores therein various types of data such as laser driving conditions and target values of the wavelength detector necessary for the digital computing unit 360 to calculate control parameters. Particularly, the memory 370 stores therein a set of the frequency of the basic frequency channel and the temperature of the wavelength filter 221 for each basic frequency channel, and a set of a measured frequency at an additional measurement frequency and the temperature of the wavelength filter 221.

The basic frequency channel is a parameter that may be set in accordance with a design concept. The basic frequency channel may use the frequency determined by a standard, for example. The spacing between the basic frequency channels may use frequency spacing such as a half period or a quarter period of the transmission characteristic of the wavelength filter 221. The spacing between the basic frequency channels is set to be larger than minimum spacing between frequencies of laser light that the wavelength tunable light source unit 200 may output by automatic frequency control (AFC) performed by the controller 300. When the spacing between the basic frequency channels is smaller than the minimum spacing between frequencies of laser light that the wavelength tunable light source unit 200 may output by the AFC performed by the controller 300, parameters for all of the frequencies capable of being output need to be stored. It is inefficient.

The additional measurement frequency is the frequency at each divided point of (n−1) divided points as a result of dividing the frequency spacing between the adjacent basic frequency channels into n divisions. The advantageous effect of the embodiment may be demonstrated by adopting at least one or more frequencies out of the frequencies at the (n−1) divided points as the additional measurement frequencies. When all of the frequencies at the (n−1) divided points are adopted as the additional measurement frequencies, the advantageous effect of the embodiment is further increased. The number of additional measurement frequencies allocated for each basic frequency channel is preferably approximately equal to or smaller than the number obtained by dividing the spacing between the adjacent basic frequency channels by minimum frequency spacing the user uses. It is inefficient that the number of additional measurement frequencies is too larger than the number of frequencies the user uses.

For example, when approximately 200 basic frequency channels are set with spacing of 25 GHz in the whole range of C-band, wavelength calibration is performed on the basic frequency channels using a wavelength meter and the driving conditions including the laser driving conditions at the respective basic frequency channels and the target values of the wavelength detector are recorded in the memory 370.

Figure 4A:
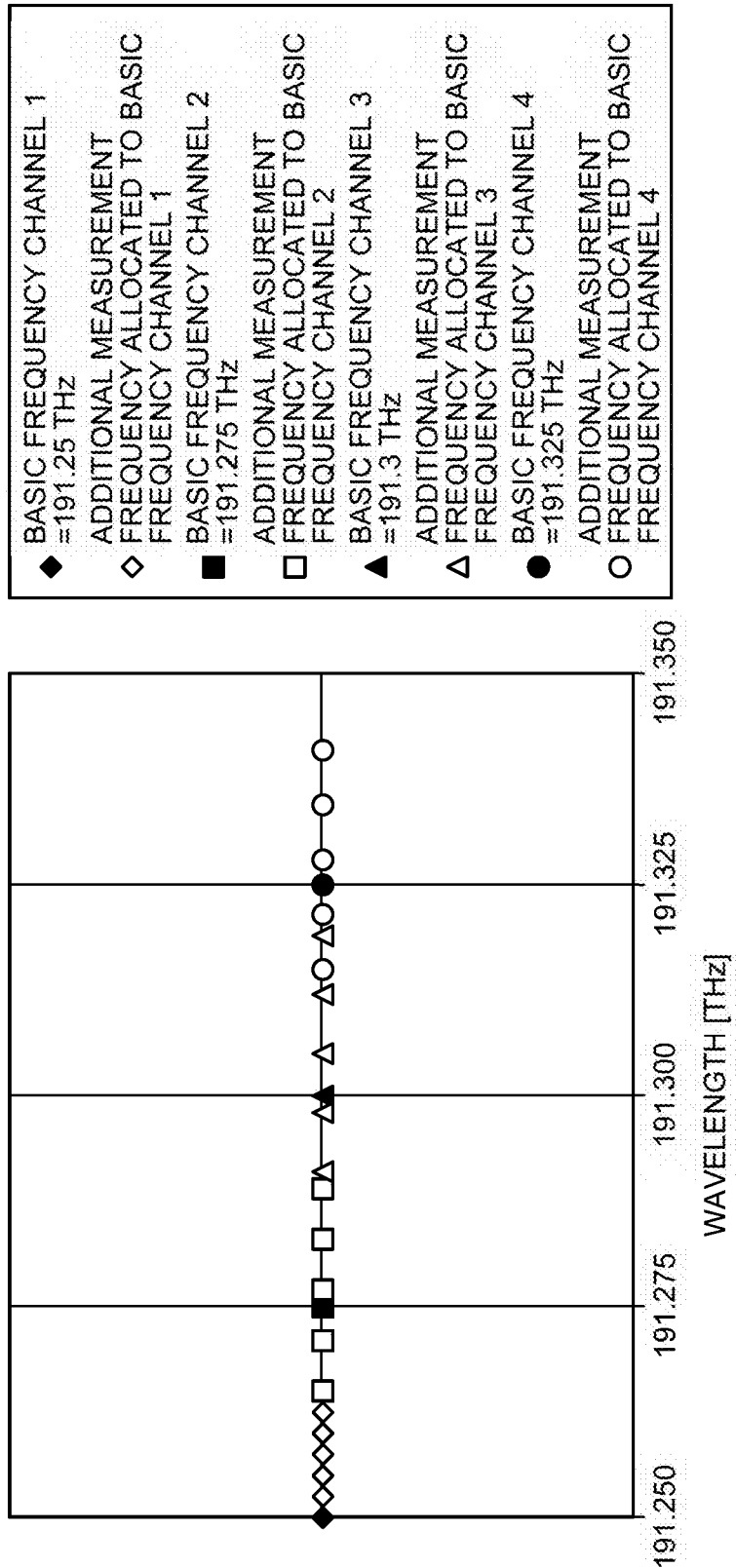
FIG. 4A is a schematic diagram illustrating a relation between basic frequency channels and additional measurement frequencies.

FIG. 4A and FIG. 4B are schematic diagrams each illustrating a relation between the basic frequency channels and the additional measurement frequencies. FIG. 4A illustrates four basic frequency channels. The starting frequency is 191.25 THz and the spacing between the basic frequency channels is 25 GHz. Basic frequency channel 1 (♦) is 191.25 THz and additional measurement frequencies (◇) at five points are allocated thereto. Basic frequency channel 2 (■) is 191.275 THz and additional measurement frequencies (□) at five points are allocated thereto. Basic frequency channel 3 (▲) is 191.3 THz and additional measurement frequencies (Δ) at five points are allocated thereto. Basic frequency channel 4 (●) is 191.325 THz and additional measurement frequencies (○) at five points are allocated thereto. The respective additional measurement frequencies are obtained by wavelength measurement using the wavelength meter. As illustrated in FIG. 4A, the spacing between the additional measurement frequencies is not necessarily set to equal spacing. The additional measurement frequencies allocated to each basic frequency channel are preferably set substantially symmetrical with respect to the basic frequency channel as the additional measurement frequencies exemplarily illustrated with (□, Δ, ○). The additional measurement frequencies may be set only on a side adjacent to the use frequency as the additional measurement frequencies exemplarily illustrated with (◇) and allocated for the end basic frequency channel (191.250 THz). The additional measurement frequencies allocated to the basic frequency channel are not limited to be set to the basic frequency channel closest to the additional measurement frequencies. For example, the additional measurement frequencies allocated to the basic frequency channel may be set such that the additional measurement frequencies allocated for different basic frequency channels are mixed together in the spacing between the basic frequency channels as the additional measurement frequencies exemplarily indicated with (○, Δ). Two or more additional measurement frequencies allocated to the basic frequency channels different from each other may be the same frequencies. As illustrated in FIG. 4A, the number of divisions for performing the additional measurement between the adjacent basic frequency channels may differ from adjacent basic frequency channels to adjacent basic frequency channels. In addition, as illustrated in FIG. 4B, the spacing between the basic frequency channels may be different.

The temperature of the wavelength filter 221 in the wavelength measurement performed on the additional measurement frequency is shifted from the temperature of the wavelength filter 221 at the basic frequency channel to which the additional measurement frequency is allocated in accordance with the temperature characteristic of the wavelength filter 221. The wavelength as the result of the measurement and the temperature of the wavelength filter 221 are stored in the memory 370 as a set of the measured frequency at the additional measurement frequency and the temperature of the wavelength filter 221.

The digital computing unit 360 is a computing unit what is called a CPU (central processing unit). The digital computing unit 360 calculates appropriate control parameters from data of the condition of the wavelength tunable light source unit 200 received from the laser temperature monitoring circuit 321, the PD1 current monitoring circuit 341, the PD2 current monitoring circuit 342, and the etalon temperature monitoring circuit 351. The digital computing unit 360 transmits control signals to the DFB-LD selection circuit 311, the DFB-LD current control circuit 312, the laser temperature control circuit 322, the SOA control circuit 330, and the etalon temperature control circuit 352.

The digital computing unit 360 is programmed so as to perform a reference step, a calculation step, and a control step. In the reference step, the digital computing unit 360 refers to data of sets of the measured frequencies and the temperatures of the wavelength filter 221 at two or more points for each basic frequency channel, the data being stored in the memory 370. In the calculation step, the digital computing unit 360 selects the basic frequency channel closest to the frequency of laser light that the laser light source 210 is instructed to emit, and calculates the temperature of the wavelength filter 221 for providing the instructed frequency of laser light from the data of the sets of the measured frequencies allocated to the basic frequency channel closest to the instructed frequency and the temperatures of the wavelength filter 221. In the control step, the digital computing unit 360 controls the transmission characteristic of the wavelength filter 221 using the calculated temperature of the wavelength filter 221.

The user's instruction of the frequency to the controller 300 via the higher-level controller is not limited to the value of the frequency. The instruction is given using indirect values in some cases. Examples of the indirect values include the starting frequency, the grid spacing, and the number of the channel. The instructed frequency may be calculated by the following expression using the indirect values serving as given information.

Instructed frequency=starting frequency+(number of the channel−1)×grid spacing

For example, the instructed frequency is calculated to be 191.8168 THz when the starting frequency=191.3 THz, the grid spacing=0.1 GHz, and the number of the channel=5169.

The following describes a specific example of a method of calculating the temperature of the wavelength filter 221 for providing the instructed frequency of laser light using the temperature of the wavelength filter 221 as a control value of the wavelength filter 221.

Calculation Method 1

The digital computing unit 360 selects the basic frequency channel closest to the instructed frequency of laser light out of the basic frequency channels stored in the memory 370. The digital computing unit 360 selects two sets of the measured frequencies allocated to the basic frequency channel closest to the instructed frequency and the temperatures of the wavelength filter 221 ((Freq1,Tf1) and (Freq2,Tf2)).

Temperature Tf of the wavelength filter 221 for providing the instructed frequency of laser light may be calculated by the following expression using the two sets of the measured frequencies and the temperatures of the wavelength filter 221 ((Freq1,Tf1) and (Freq2,Tf2)).

$Tf = Tf1 + [(Tf2 - Tf1)/(Freq2 - Freq1)] \times (Freq\_target - Freq1)$ where Freq_target is the instructed frequency of laser light.

As the two sets of the frequencies and the temperatures of the wavelength filter 221, a set of the frequency of the basic frequency channel and the temperature of the wavelength filter 221, and a set of the measured frequency at the additional measurement frequency and the temperature of the wavelength filter 221 may be selected. For the calculation, the additional measurement may be performed on the frequencies at at least one or more divided points out of the (n−1) divided points between the adjacent basic frequency channels.

The calculation method described above employs a simple linear approximation using the two additional measurement frequencies. The calculation method may employ a linear approximation using a least-square method with a number of additional measurement frequencies. The calculation method is not limited to employ the linear approximation. The calculation method may employ a second or higher order polynomial approximation. As for an interpolation method, interpolation and extrapolation may be used. The linear approximation or the second or higher order polynomial approximation may be employed using data of the measured frequencies interposing the instructed frequency therebetween and the temperatures of the wavelength filter 221. The linear approximation or the second or higher order polynomial approximation may be employed using data of the measured frequencies that do not interpose the instructed frequency and the temperatures of the wavelength filter 221.

Calculation Method 2

In the same manner as calculation method 1, the digital computing unit 360 selects two sets of the measured frequencies allocated to the basic frequency channel closest to the instructed frequency of laser light out of the basic frequency channels stored in the memory 370 and the temperatures of the wavelength filter 221 ((Freq1_a,Tf1_a) and (Freq2_a,Tf2_a)).

Candidate temperature Tf_a of the wavelength filter 221 for providing the instructed frequency of laser light may be calculated by the following expression using the two sets of (Freq1_a,Tf1_a) and (Freq2_a,Tf2_a).

$$Tf\_a = Tf1\_a + [(Tf2\_a - Tf1\_a)/(Freq2\_a - Freq1\_a)] \times (Freq\_target - Freq1\_a)$$

In addition, the digital computing unit 360 selects two sets of the measured frequencies allocated to the basic frequency channel secondly closest to the instructed frequency of laser light out of the basic frequency channels stored in the memory 370 and the temperatures of the wavelength filter 221 ((Freq1_b,Tf1_b) and (Freq2_b,Tf2_b)). In the same manner as the calculation of Tf_a, candidate temperature Tf_b of the wavelength filter 221 for providing the instructed frequency of laser light may be calculated by the following expression.

$$Tf\_b = Tf1\_b + [(Tf2\_b - Tf1\_b)/(Freq2\_b - Freq1\_b)] \times (Freq\_target - Freq1\_b)$$

From two candidate temperatures Tf_a and Tf_b, the one closer to the center value of the temperature of the wavelength filter 221 stored in the memory 370 is adopted as the temperature of the wavelength filter 221 for providing the instructed frequency of laser light.

In the same manner as calculation method 1, the calculation method described above may employ a linear approximation using a least-square method with a number of additional measurement frequencies and a second or higher order polynomial approximation. As for the interpolation method, interpolation and extrapolation may be used.

Figure 5:
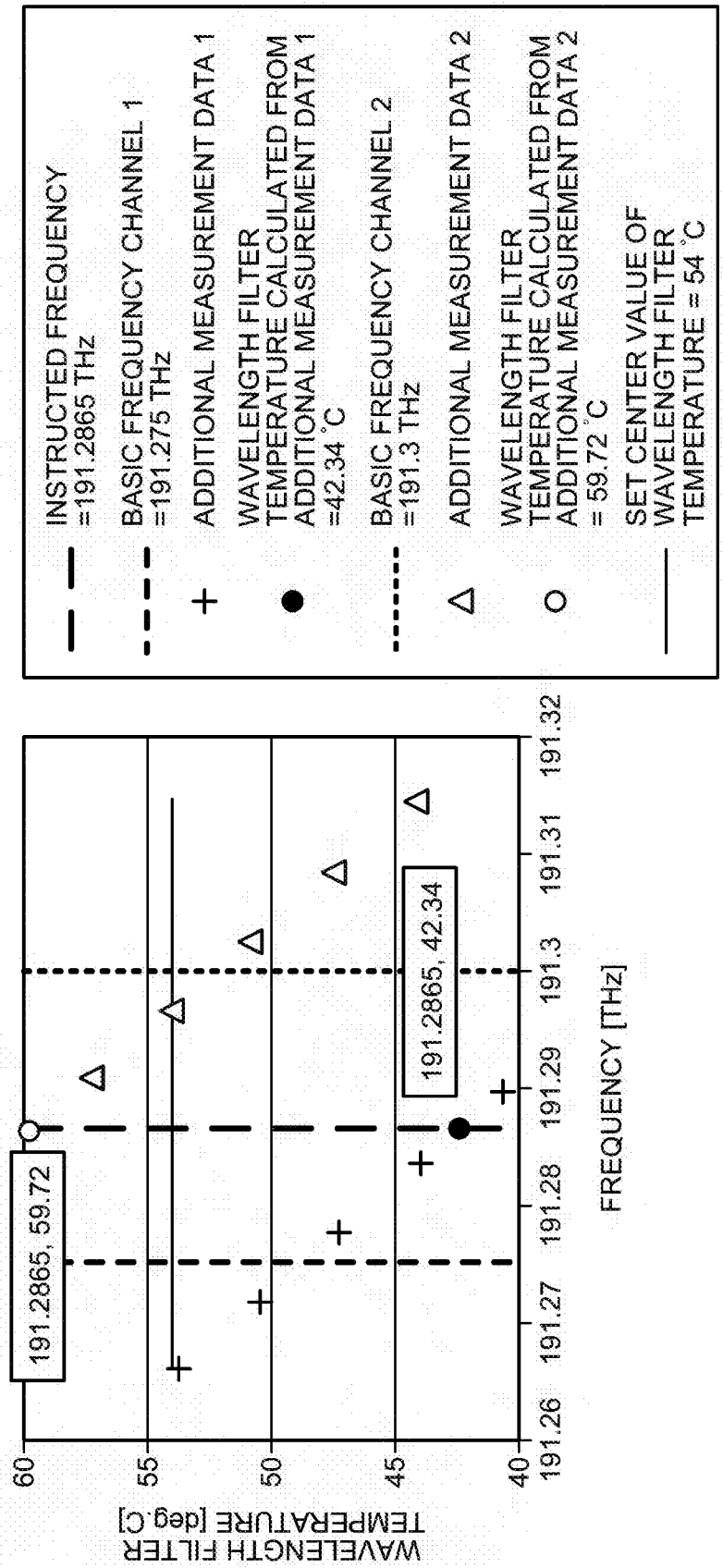
FIG. 5 is a schematic diagram explaining an effect of calculation method 2.

FIG. 5 is a schematic diagram explaining an effect of calculation method 2. In the graph illustrated in FIG. 5, the abscissa axis represents the frequency, the ordinate axis represents the temperature of the wavelength filter 221, and the instructed frequency of laser light is 191.2865 THz. In the graph, plotted are the sets of the measured frequencies allocated to basic frequency channel 1 (191.275 THz) closest to the instructed frequency of laser light and the temperatures of the wavelength filter 221, and the sets of the measured frequencies allocated to basic frequency channel 2 (191.3 THz) secondly closest to the instructed frequency of laser light and the temperatures of the wavelength filter 221. The spacing between the basic frequency channels is 25 GHz. The center value of the temperature of the wavelength filter 221 stored in the memory 370 is 54° C.

Specifically, additional measurement data 1 (+) at five points are the sets of the measured frequencies allocated to basic frequency channel 1 closest to the instructed frequency and the temperatures of the wavelength filter 221, and additional measurement data 2 (Δ) at five points are the sets of the measured frequencies allocated to basic frequency channel 2 secondly closest to the instructed frequency and the temperatures of the wavelength filter 221. The wavelength filter temperature (●) is the wavelength filter temperature at the instructed frequency of laser light calculated by interpolating the additional measurement data 1 (+) while the wavelength filter temperature (○) is the wavelength filter temperature at the instructed frequency of laser light calculated by extrapolating the additional measurement data 2 (Δ).

As may be seen from FIG. 5, the wavelength filter temperature (○) calculated from the additional measurement data (Δ) of basic frequency channel 2 secondly closest to the instructed frequency is closer to the center value (=54° C.) of the temperature of the wavelength filter 221 than the wavelength filter temperature (●) calculated from the additional measurement data (+) of basic frequency channel closest to the instructed frequency. In this case, calculation method 2 adopts the wavelength filter temperature (○) calculated from the additional measurement data (Δ) of basic frequency channel 2 secondly closest to the instructed frequency as the temperature of the wavelength filter 221 for providing the instructed frequency of laser light. As described above, calculation method 2 adopts the wavelength filter temperature closer to the center value of the temperature of the wavelength filter 221 as the temperature of the wavelength filter 221 for providing the instructed frequency of laser light. When the center value of the temperature of the wavelength filter 221 stored in the memory 370 is preliminarily set to an appropriate value, a low temperature that causes power consumed by the Peltier element 222 to be increased is not adopted as the temperature of the wavelength filter 221. As a result, power consumed by the Peltier element 222 may be kept low. The example of the calculation method of the filter temperature illustrated in FIG. 5 uses only the additional measurement data of the additional measurement frequencies allocated to the basic frequency channels and the temperatures of the wavelength filter 221. The data of the frequencies of the basic frequency channels and the temperatures of the wavelength filter 221 may be used besides the additional measurement data.

Control Method

Figure 6:
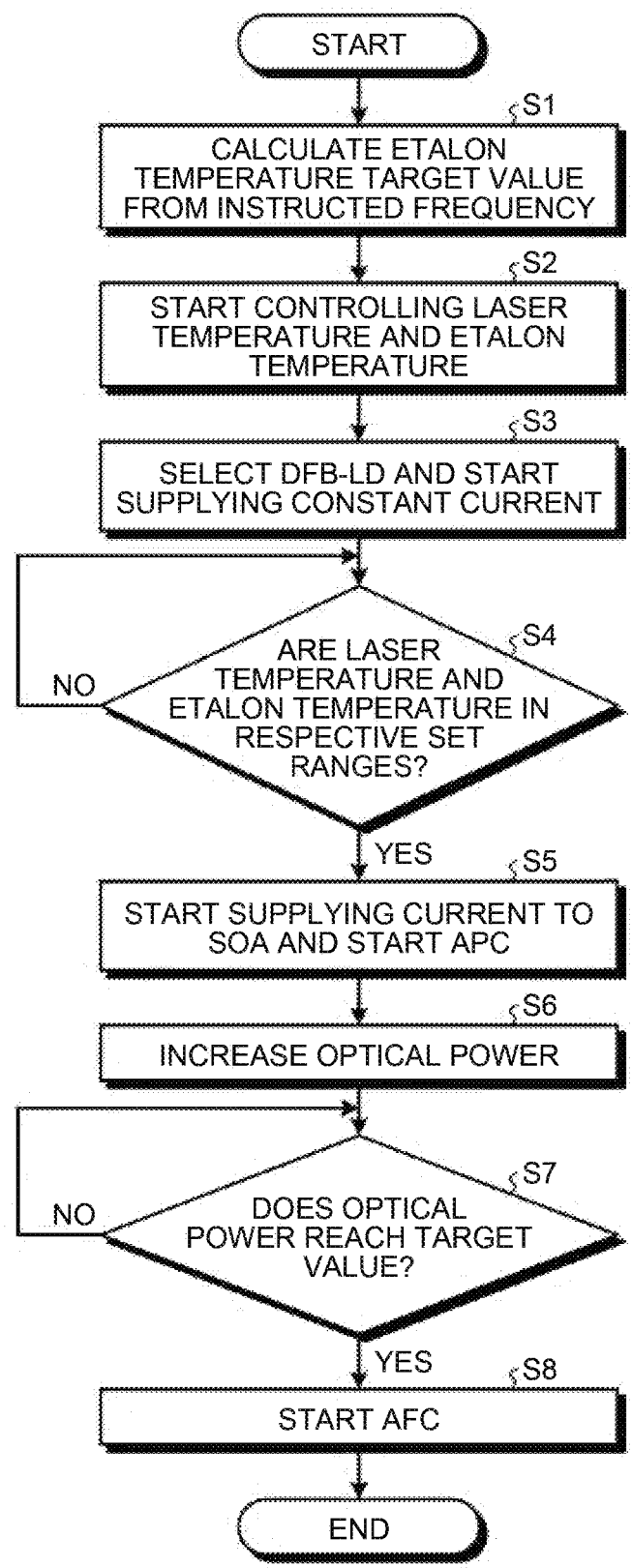
FIG. 6 is a schematic diagram illustrating an example of the whole flow of a control method of the wavelength tunable laser module according to a first embodiment.

The following describes the whole flow of a control method of the wavelength tunable laser module 100 with reference to FIG. 6. FIG. 6 is a schematic diagram illustrating an example of the whole flow of the control method of the wavelength tunable laser module.

As described above, the data including the number and the temperature of the DFG-LD 211, the temperature of the wavelength filter 221, the current supplied to the DFB-LD 211, and the PD current ratio (=PD1/PD2) serving as a feedback control target value is stored as the initial value for each basic frequency channel in the memory 370 of the controller 300. The data is acquired by the wavelength calibration using the wavelength meter and recorded in the memory 370 prior to the shipment of the wavelength tunable laser module.

In addition, in the memory 370 of the controller 300, the data is stored that includes frequencies at five points and the respective temperatures of the wavelength filter 221 (the data of the frequency of the basic frequency channel and the temperature of the wavelength filter 221, and the data of the measured frequencies at the four additional measurement frequencies and the respective temperatures of the wavelength filter 221) for each basic frequency channel, for example. The data is acquired by the wavelength measurement using the wavelength meter and recorded in the memory 370 prior to the shipment of the wavelength tunable laser module.

At step S1, the controller 300 calculates the target value of the temperature of the wavelength filter 221 in accordance with the frequency instructed by the user via the higher-level controller. Specifically, the digital computing unit 360 of the controller 300 refers to the data of the set of the measured frequencies and the temperatures of the wavelength filter 221 at two or more points for each basic frequency channel, the data being stored in the memory 370, selects the basic frequency channel closest to the frequency of laser light instructed by the user to cause the laser light source 210 to emit, and calculates the temperature of the wavelength filter 221 for providing the instructed frequency of laser light from the data of the sets of the measured frequencies allocated to the basic frequency channel closest to the instructed frequency and the temperatures of the wavelength filter 221.

At step S2, controlling the temperatures of the DFB-LD 211 and the wavelength filter 221 starts.

The digital computing unit 360 of the controller 300 transmits the control signal to the etalon temperature control circuit 352 so as to cause the temperature of the wavelength filter 221 to reach the calculated target value, and starts monitoring the temperature of the wavelength filter 221 via the filter temperature monitoring element 223 and the etalon temperature monitoring circuit 351.

Figure 7:
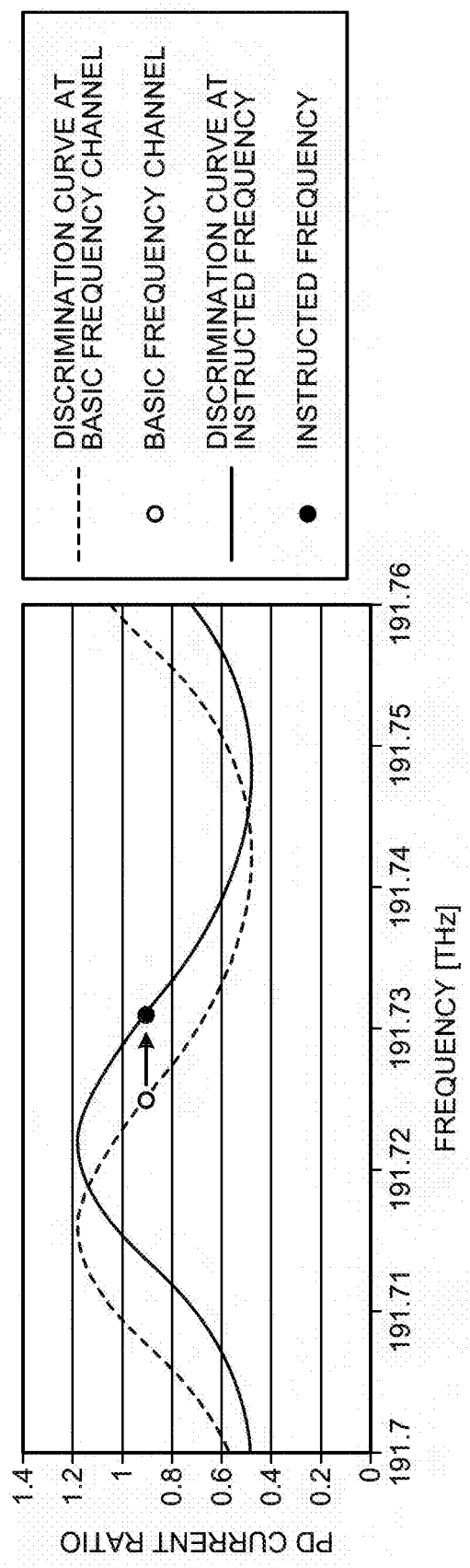
FIG. 7 is a schematic diagram illustrating an example of shifting a discrimination curve in a wavelength direction.

As a result, as illustrated in FIG. 7, the discrimination curve corresponding to the frequency instructed by the user is obtained that is shifted from the discrimination curve of the wavelength filter 221 at the basic frequency channel in the wavelength direction. FIG. 7 is a schematic diagram illustrating an example of the shifting of the discrimination curve in the wavelength direction. In FIG. 7, the discrimination curve at the basic frequency channel is indicated with the broken line while the discrimination curve corresponding to the frequency instructed by the user is indicated with the solid line.

At step S3, the DFB-LD 211 corresponding to the basic frequency channel is selected out of the multiple DFB-LDs 211 and supplying a constant current to the selected DFB-LD 211 starts. Specifically, the digital computing unit 360 of the controller 300 transmits the respective control signals to the DFB-LD selection circuit 311 and the DFB-LD current control circuit 312.

At step S4, the digital computing unit 360 of the controller 300 stands by until both of the temperatures of the DFB-LD 211 and the wavelength filter 221 are in respective set ranges. Specifically, the digital computing unit 360 of the controller 300 monitors temperature information from the laser temperature monitoring circuit 321 and the etalon temperature monitoring circuit 351 and determines whether the temperatures of the DFB-LD 211 and the wavelength filter 221 are in the respective set ranges.

If both of the temperatures of the DFB-LD 211 and the wavelength filter 221 are in the respective set ranges, supplying a current to the SOA 214 starts and auto power control (APC) starts at step S5. Specifically, the digital computing unit 360 of the controller 300 transmits the control signal to the SOA control circuit, and performs feedback control such that the current from the power monitor 240 reaches the target value stored in the memory 370 while monitoring the power of the laser light source 210 via the power monitor 240 and the PD1 current monitoring circuit 341.

Figure 8:
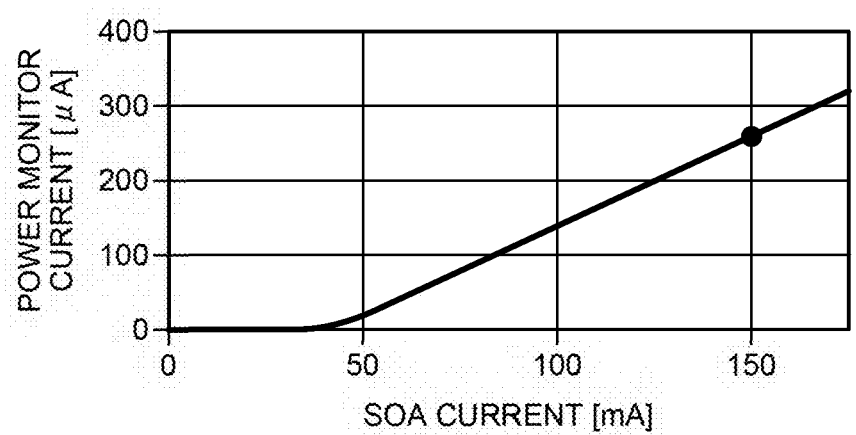
FIG. 8 is a graph illustrating a relation between a current supplied to a semiconductor optical amplifier (SOA) and a current output by a power monitor.

As illustrated in FIG. 8, with an increase in current supplied to the SOA 214, the current output by the power monitor 240 is increased. FIG. 8 is a graph illustrating a relation between the current supplied to the SOA and the current output by the power monitor. At step S6 and step S7, the power of the laser light source 210 may be adjusted to the target value while the power of the laser light source 210 is increased and whether the power of the laser light source 210 reaches the target value is monitored using the relation illustrated in FIG. 8.

If the power of the laser light source 210 reaches the target value, auto frequency control (AFC) is performed at step S8. Specifically, the digital computing unit 360 of the controller 300 monitors the current (PD1) output from the power monitor 240 via the PD1 current monitoring circuit 341 and the current (PD2) output from the wavelength monitor 250 via the PD2 current monitoring circuit 342, and calculates the PD current ratio (PD2/PD1).

Figure 9:
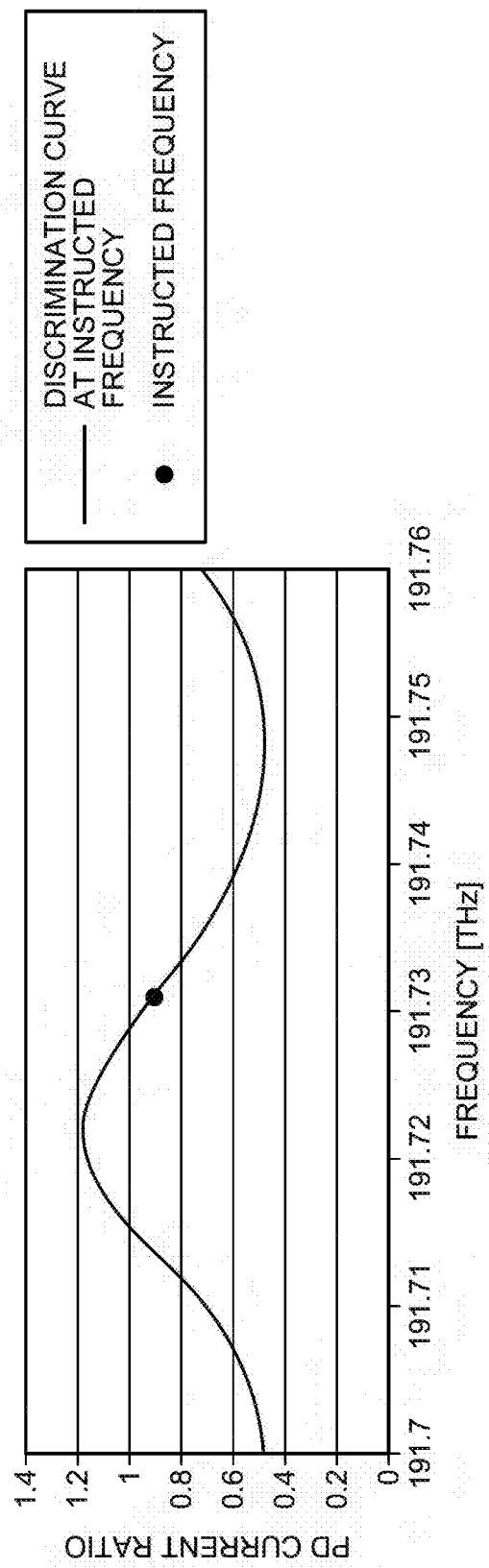
FIG. 9 is a schematic diagram illustrating an example of the discrimination curve shifted so as to correspond to an instructed frequency.

The digital computing unit 360 of the controller 300 performs feedback control such that the calculated PD current ratio becomes the PD current ratio stored in the memory 370 as the feedback control target value of the basic frequency channel on the basis of the discrimination curve illustrated in FIG. 9. FIG. 9 is a graph illustrating an exemplary discrimination curve that corresponds to the instructed frequency and is obtained by controlling the temperature of the wavelength filter 221 so as to become the etalon temperature target value obtained at step S1.

The discrimination curve used for the AFC at step S8 is obtained by shifting the discrimination curve at the basic frequency channel in the wavelength direction. The feedback control target value used for the AFC at step S8 may use the PD current ratio stored in the memory 370 as the feedback control target value of the basic frequency channel.

Accuracy Verification

Figure 10:
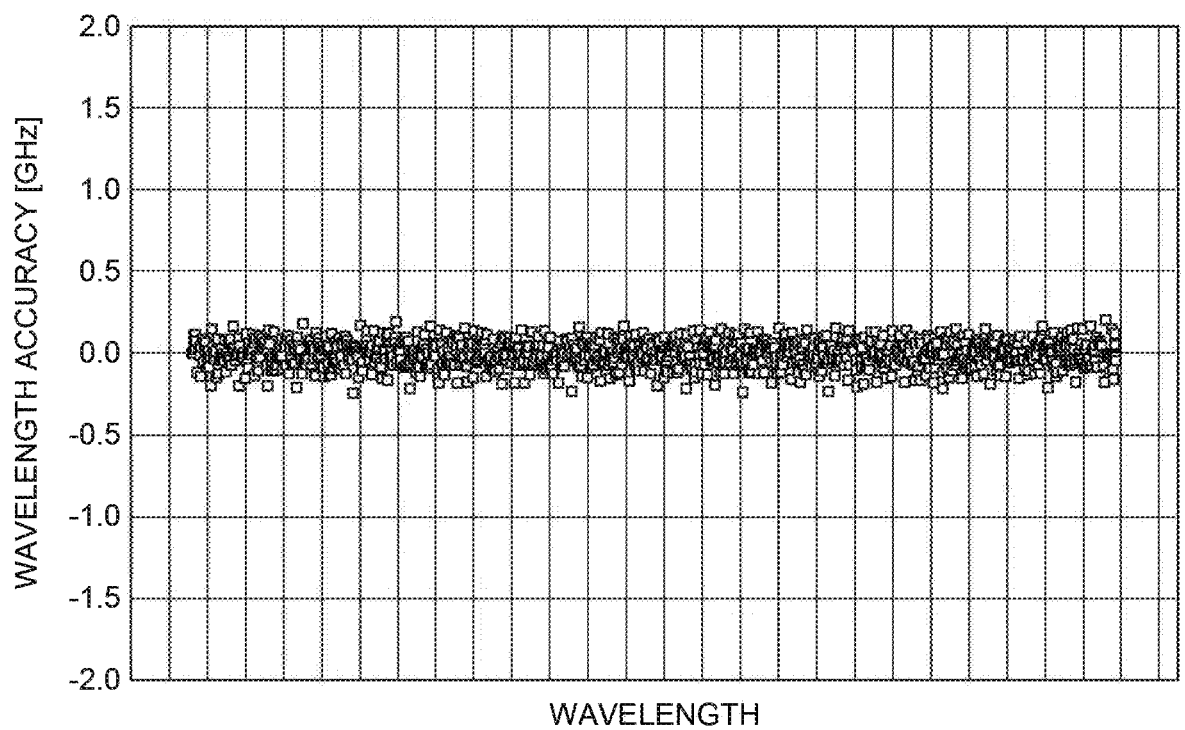
FIG. 10 is a graph illustrating an exemplary measurement result of wavelength accuracies in the wavelength control method of the wavelength tunable laser module according to the first embodiment.
Figure 11:
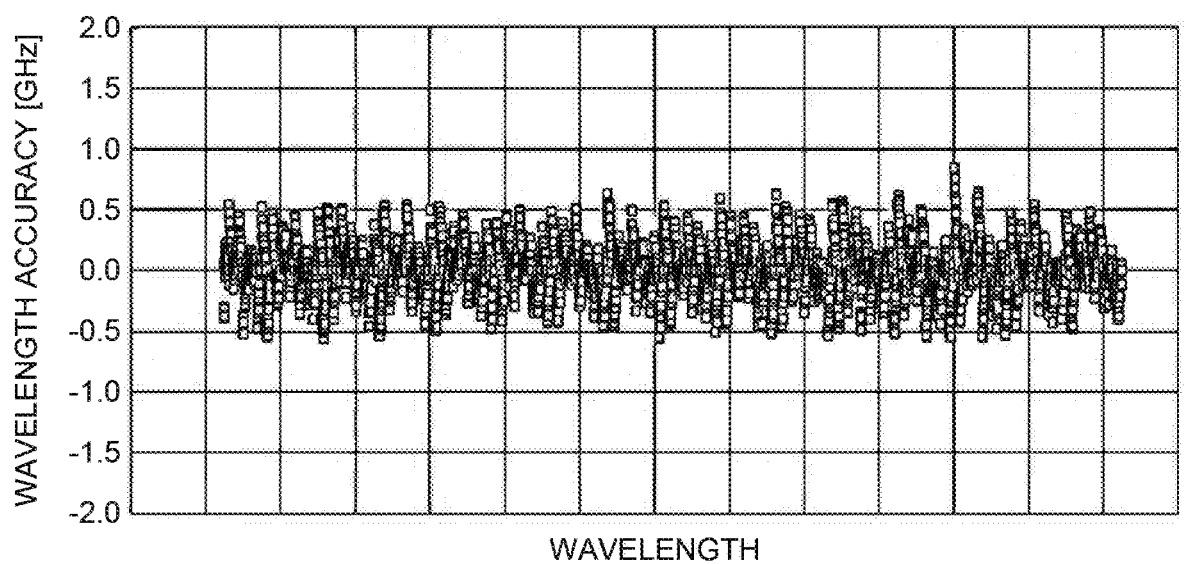
FIG. 11 is a graph illustrating an exemplary measurement result of wavelength accuracies in the wavelength control method of the wavelength tunable laser module according to a comparative example.

FIG. 10 is a graph illustrating an exemplary measurement result of wavelength accuracies in the wavelength control method of the wavelength tunable laser module according to the embodiment. FIG. 11 is a graph illustrating an exemplary measurement result of wavelength accuracies in the wavelength control method of the wavelength tunable laser module as a comparative example. In the measurement result of the wavelength accuracies illustrated in FIG. 10, the wavelength accuracy is measured with a spacing of 0.1 GHz when C-band is divided by a spacing of 25 GHz to set basic frequency channels and the additional measurement frequencies are set by dividing the spacing between the adjacent basic frequency channels into six divisions in the embodiment. In the measurement result of the wavelength accuracies illustrated in FIG. 11, the wavelength accuracy is measured with a spacing of 0.1 GHz in a method that determines the temperature of the wavelength filter (a shift amount of the discrimination curve) from the temperature characteristic of the wavelength filter. The wavelength accuracies are measured using the same wavelength meter for both cases illustrated in FIGS. 10 and 11.

As may be seen from the comparison between FIGS. 10 and 11, the wavelength accuracy is approximately ±0.6 GHz in the comparative example. In the embodiment, the wavelength accuracy is approximately ±0.2 GHz, which is more accurate than that in the comparative example. The method of controlling the wavelength of the wavelength tunable laser module according to the embodiment may perform control on all of the use frequencies without preliminarily storing the control parameters for all of the use frequencies. In addition, the method of controlling the wavelength of the wavelength tunable laser module according to the embodiment may increase the wavelength accuracy. With the present disclosure, a method of controlling the wavelength of the wavelength tunable laser module that may perform control on all of the use frequencies without preliminarily storing control parameters for all of the use frequencies may be provided.

Second Embodiment

Configuration of Wavelength Tunable Laser Module

Figure 12:
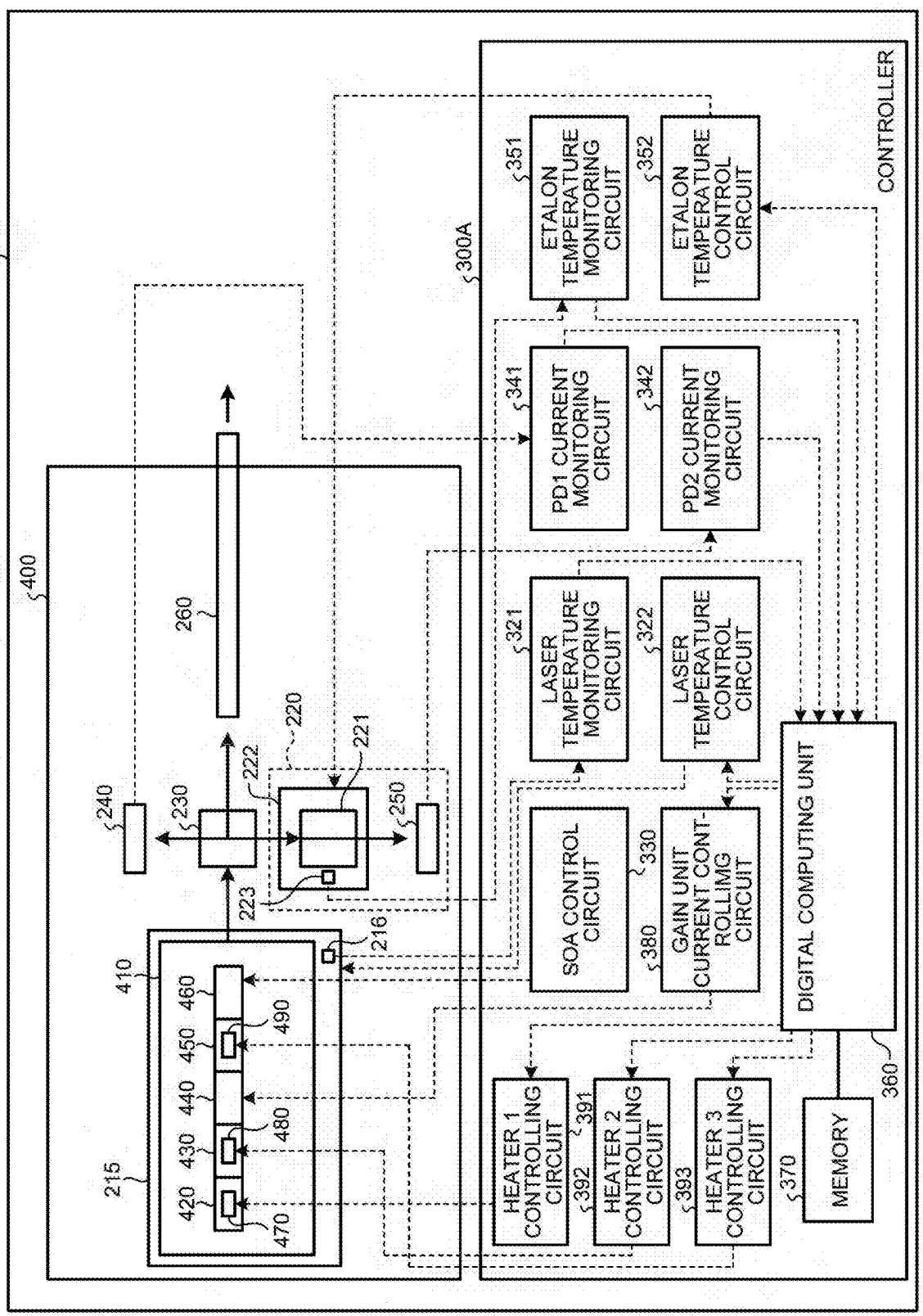
FIG. 12 is a schematic diagram illustrating an exemplary structure of a wavelength tunable laser module according to a second embodiment.

FIG. 12 is a schematic diagram illustrating an exemplary structure of a wavelength tunable laser module according to a second embodiment. A wavelength tunable laser module 100A illustrated in FIG. 12 includes a wavelength tunable light source unit 400 and a controller 300A in the place of the wavelength tunable light source unit 200 and the controller 300 in the above-described first embodiment, respectively.

In the second embodiment, elements or parts corresponding to those in the first embodiment are designated by the corresponding reference symbols, and the repetitive explanation is omitted.

First, detailed explanations are made on a configuration of the wavelength tunable light source unit 400.

The wavelength tunable light source unit 400 includes an integrated laser element 410 in the place of the laser light source 210 described above in the first embodiment, a Peltier element 215, and a laser temperature monitoring element 216.

The integrated laser element 410 includes a first wavelength selecting unit 420, a phase adjusting unit 430, a gain unit 440, a second wavelength selecting unit 450, and an SOA 460. The integrated laser element 410 is realized as, for example, a monolithic integrated laser element. However, without limiting to such a laser element, the integrated laser element 410 may be realized as a hybrid integrated laser element configured of a combination of a silicon (Si) waveguide and a gain chip.

The first wavelength selecting unit 420 is a reflecting element that generates a first comb-shaped reflection spectrum of which characteristic is changed depending on a refraction index. The first wavelength selecting unit 420 is provided with a first heater portion 470 (simply referred to as a "heater 1", hereinafter). The controller 300A described below controls the heater 1 to change the optical characteristic of the first comb-shaped reflection spectrum generated by the first wavelength selecting unit 420, more specifically, to shift reflection peaks in the first comb-shaped reflection spectrum with respect to wavelength.

The heater 1 is, for example, a micro-heater, and changes a temperature of the first wavelength selecting unit 420 with an electric current supplied thereto from the controller 300A, thereby to change a refraction index, making use of physical properties of the first wavelength selecting unit 420.

The second wavelength selecting unit 450 is also a reflecting element that generates a second comb-shaped reflection spectrum of which characteristic is changed depending on a refraction index. Spectrum peak intervals in the second comb-shaped reflection spectrum generated by the second wavelength selecting unit 450 are different from those in the first comb-shaped reflection spectrum generated by the first wavelength selecting unit 420. Similarly to the first wavelength selecting unit 420, the second wavelength selecting unit 450 is provided with a second heater portion 490 (simply referred to as a "heater 2", hereinafter). The controller 300A described below controls the heater 2 to change the optical characteristic of the second comb-shaped reflection spectrum generated by the second wavelength selecting unit 450, specifically, to shift reflection peaks in the second comb-shaped reflection spectrum with respect to wavelength.

The heater 2 is, for example, a micro-heater, and changes a temperature of the second wavelength selecting unit 450 with an electric current supplied thereto from the controller 300A, thereby to change a refraction index, making use of physical properties of the second wavelength selecting unit 450.

The first wavelength selecting unit 420 and the second wavelength selecting unit 450 are paired with each other, and constitute a laser resonator. Each of the first wavelength selecting unit 420 and the second wavelength selecting unit 450 generates a comb-shaped reflection spectrum where plural reflection peaks are formed substantially periodically with respect to wavelength. Because reflection peak intervals are slightly different from each other between the first wavelength selecting unit 420 and the second wavelength selecting unit 450, the comb-shaped reflection spectra generated by the wavelength selecting units 420, 450 coincide with each other at only one reflection peak having a particular wavelength. Therefore, the laser resonator constituted by the first wavelength selecting unit 420 and the second wavelength selecting unit 450 allows for narrow line width lasing at the coincided wavelength.

Additionally, because the first wavelength selecting unit 420 is provided with the heater 1 and the second wavelength selecting unit 450 is provided with the heater 2, the reflection peaks can be independently shifted. With this, the coincided reflection peak is also changed, so that the laser resonator constituted by the pair of the first wavelength selecting unit 420 and the second wavelength selecting unit 450 allows for lasing at a wavelength in a wide wavelength range.

The laser resonator constituted by the pair of the first wavelength selecting unit 420 and the second wavelength selecting unit 450 is accompanied by the phase adjusting unit 430, the gain unit 440, and the SOA 460.

The phase adjusting unit 430 is provided in order to adjust a resonator length of the laser resonator constituted by a pair of the first wavelength selecting unit 420 and the second wavelength selecting unit 450, by changing the refraction index. The phase adjusting unit 430 is provided with a third heater portion 480 (simply referred to as a "heater 3", hereinafter).

The heater 3 is, for example, a micro-heater, and changes a temperature of the phase adjusting unit 430 with an electric current supplied thereto from the controller 300A, thereby to change a refraction index, making use of physical properties of the phase adjusting unit 430.

The gain unit 440 receives a driving current supplied from the controller 300A and supplies energy to the laser resonator constituted by the pair of the first wavelength selecting unit 420 and the second wavelength selecting unit 450, thereby to generate an optically amplifying gain. Namely, the controller 300A is capable of controlling a power of laser light emitted by the integrated laser element 410 by controlling the driving current to be supplied to the gain unit 440.

The SOA 460 receives a driving current (SOA current) supplied from the controller 300A, amplifies the laser light emitted from the laser resonator with the driving current, and emits the amplified laser light to an optical demultiplexer 230.

A wavelength detector 220, which includes a wavelength filter (etalon filter) 221, a Peltier element 222, a filter temperature monitoring element 223, and a wavelength monitor 250, is configured in the same manner as that in the first embodiment.

Configuration of Controller

Next, explanations are made on the controller 300A.

Referring to FIG. 12, the controller 300A includes a gain unit current controlling circuit 380, a heater 1 controlling circuit 391, a heater 2 controlling circuit 392, a heater 3 controlling circuit 393, a laser temperature monitoring circuit 321, a laser temperature control circuit 322, an SOA control circuit 330, a PD1 current monitoring circuit 341, a PD2 current monitoring circuit 342, an etalon temperature monitoring circuit 351, an etalon temperature control circuit 352, a digital computing unit 360, and a memory 370.

The gain unit current controlling circuit 380 is configured to supply a driving current to be supplied to the gain unit 440 and control the driving current, under control of the digital computing unit 360.

The heater 1 controlling circuit 391 is configured to supply a driving current to be supplied to the heater 1 and control the driving current, under control of the digital computing unit 360.

The heater 2 controlling circuit 392 is configured to supply a driving current to be supplied to the heater 2 and control the driving current, under control of the digital computing unit 360.

The heater 3 controlling circuit 393 is configured to supply a driving current to be supplied to the heater 3 and control the driving current, under control of the digital computing unit 360.

The memory 370 stores the data including a heater 1 current value, a heater 2 current value, a heater 3 current value, a gain unit current value, an SOA current value, a laser temperature, an etalon temperature, power monitor PD current values, a PD current ratio (=PD1/PD2) serving as a feedback control target value, as initial values for each basic frequency channel. The data is acquired by the wavelength calibration using a wavelength meter and stored in the memory 370 prior to the shipment of the wavelength tunable light source unit 400. The memory 370 stores various programs that are executed by the digital computing unit 360.

The digital computing unit 360 controls the driving current supplied to the Peltier element 222 from the etalon temperature controlling circuit 352 based on the etalon temperature value input from the etalon temperature monitoring circuit 351, so that a temperature of the etalon filter 221 is kept at a constant target temperature. Additionally, the digital computing unit 360 selects a lasing wavelength of the integrated laser element 410 by controlling the heater 1 controlling circuit 391, the heater 2 controlling circuit 392, and the heater 3 controlling circuit 393 thereby to adjust the temperatures of the heater 1, the heater 2, and the heater 3, respectively. Moreover, the digital computing unit 360 keeps the selected wavelength constant by performing the AFC control where a target value of the PD current ratio is set to be the predetermined value stored in the memory The digital computing unit 360 controls the SOA current supplied to the SOA 460 from the SOA current controlling circuit 330, so as to perform the APC control where a target current value of the power monitor 240 is set to be the initial value stored in the memory 370, so that an output power of the laser light emitted by the integrated laser element 410 is kept constant.

General Explanation of Controlling Method

Figure 13A:
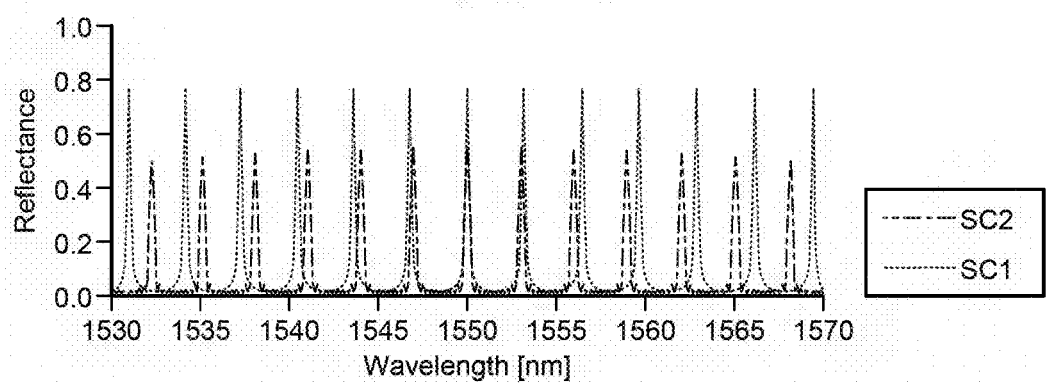
FIG. 13A illustrates a reflection characteristic of a first wavelength selecting unit of the wavelength tunable laser module according to the second embodiment.
Figure 13B:
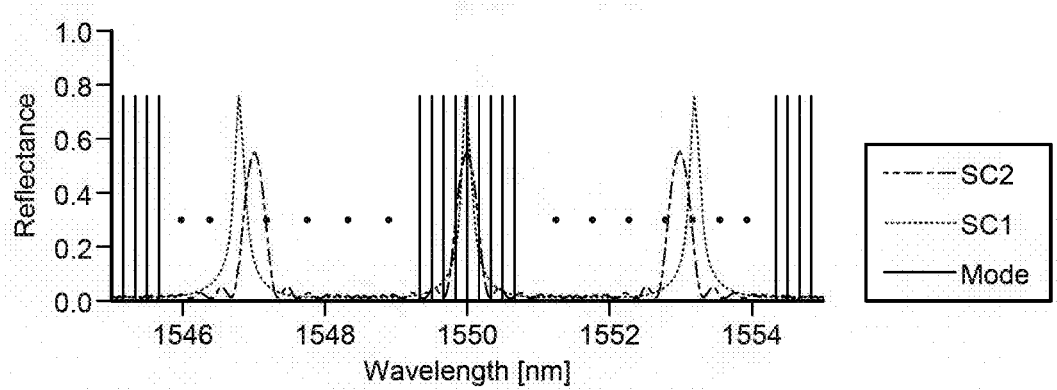
FIG. 13B illustrates a reflection characteristic of a second wavelength selecting unit of the wavelength tunable laser module according to the second embodiment.

Here, general explanations are made on a controlling method of the integrated laser element 410 utilizing a vernier effect, taking the above-described configuration as an example. FIGS. 13A and 13B illustrate reflection characteristics of the first wavelength selecting unit 420 and the second wavelength selecting unit 450. FIG. 13B is an enlarged view of the reflection spectrum in a wavelength range of 1550 nm and around in FIG. 13A. In FIGS. 13A and 13B, a horizontal axis represents wavelength and a vertical axis represents reflectance. A dot-line (SC1) indicates the first comb-shaped reflection spectrum in the first wavelength selecting unit 420, and a dot-and-dash line (SC2) indicates the second comb-shaped reflection spectrum in the second wavelength selecting unit 450. Additionally, a solid line (Mode) indicates resonator modes of the laser resonator constituted by the pair of the first wavelength selecting unit 420 and the second wavelength selecting unit 450. The resonator modes exist at least in a wavelength range from 1530 nm through 1570 nm.

Figure 14:
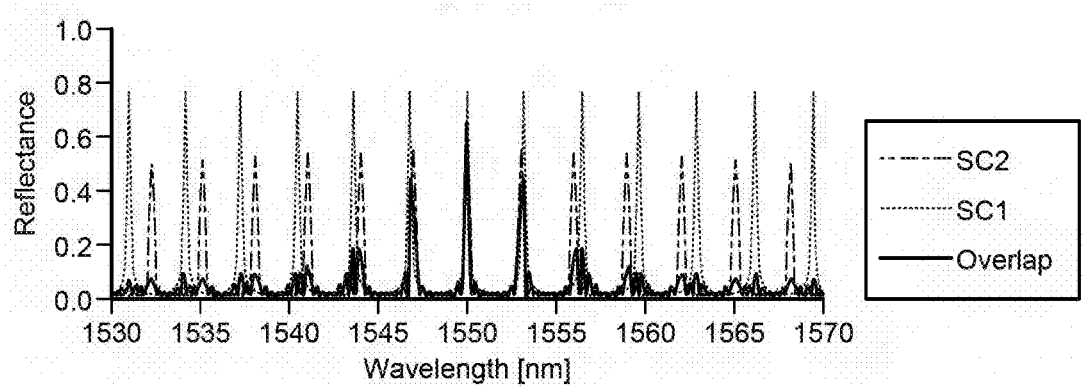
FIG. 14 is a graph illustrating a superposition of the first comb-shaped reflection spectrum and the second comb-shaped reflection spectrum.

FIG. 14 is a graph illustrating a superposition of the first comb-shaped reflection spectrum and the second comb-shaped reflection spectrum. Similarly to FIGS. 13A and 13B, a horizontal axis represents wavelength and a vertical axis represents reflectance in the graph of FIG. 14. A Dot-line (SC1) indicates the first comb-shaped reflection spectrum in the first wavelength selecting unit 420, and a dot-and-dash line (SC2) indicates the second comb-shaped reflection spectrum in the second wavelength selecting unit 450 in FIG. 14. Additionally, a spectrum obtained by superposing (multiplying) the first comb-shaped reflection spectrum with the second comb-shaped reflection spectrum is illustrated by a solid line (Overlap).

As seen in FIGS. 13A and 13B, the reflection peak intervals of the first comb-shaped reflection spectrum (SC1) in the first wavelength selecting unit 420 are slightly different from those of the second comb-shaped reflection spectrum (SC2) in the second wavelength selecting unit 450. Therefore, the first comb-shaped reflection spectrum and the second comb-shaped reflection spectrum coincide with each other at only one reflection peak having a wavelength of 1550 nm in the illustrated example. Namely, as seen in FIG. 14, the spectrum (Overlap) obtained by superposing the first comb-shaped reflection spectrum (SC1) and the second comb-shaped reflection spectrum (SC2) has the largest reflectance at a wavelength of 1550 nm.

Incidentally, as illustrated in FIGS. 13A and 13B, the reflection peaks of the first comb-shaped reflection spectrum (SC1) are steeper and spaced at wider intervals compared with those of the second comb-shaped reflection spectrum (SC2). In this manner, steeper reflection peaks are preferably spaced at wider intervals than less steep reflection peaks. This is because lasing due to reflection peaks adjacent to the largest reflection peak can be strongly suppressed, or a side-mode suppression ratio can be increased. Namely, in this example of FIG. 14, a reflection peak (around at a wavelength of 1547 nm) adjacent to the reflection peak at 1550 nm is decreased.

As explained above, the first wavelength selecting unit 420 is provided with the heater 1, and the second wavelength selecting unit 450 is provided with the heater 2, so that the first comb-shaped reflection spectrum (SC1) and the second comb-shaped reflection spectrum (SC2) can be independently shifted. FIG. 14 illustrates a state where a lasing wavelength is selected roughly at a wavelength of 1550 nm, or a so-called supermode is determined.

Meanwhile, the phase adjustment unit 430 adjusts the resonator length of the laser resonator constituted by the pair of the first wavelength selecting unit 420 and the second wavelength selecting unit 450, thereby to fine-tune the resonator mode. After the lasing wavelength is roughly selected by shifting the first comb-shaped reflection spectrum (SC1) and the second comb-shaped reflection spectrum (SC2) as explained above, the resonator mode comes in agreement with the supermode. With this, the lasing is caused by the laser resonator constituted by the pair of the first wavelength selecting unit 420 and the second wavelength selecting unit 450 in a state where the supermode is in agreement with the resonator mode.

When the lasing wavelength is changed, the following is performed. For example, while the refraction index of the first wavelength selecting unit 420 is kept constant, the refraction index of the second wavelength selecting unit 450 is increased. With this, the second comb-shaped reflection spectrum (SC2) in the second wavelength selecting unit 450 is shifted entirely toward longer wavelength direction. As a result, while the reflection peak at a wavelength of 1550 nm once has the largest reflectance among the reflection peaks obtained by superposing the first comb-shaped reflection spectrum (SC1) and the second comb-shaped reflection spectrum (SC2), another reflection peak (around at a wavelength of 1553 nm) has the largest reflectance (transition of the supermode). Then, when the resonator mode is fine-tuned using the phase adjusting unit 430, the lasing is caused at a lasing wavelength of 1553 nm and around.

Incidentally, when the lasing wavelength is changed toward the shorter wavelength direction, while the refraction index of the second wavelength selecting unit 450 is kept constant, the refraction index of the first wavelength selecting unit 420 is increased, and an adjustment operation may be performed as explained above. Additionally, when both of the refraction index of the first wavelength selecting unit 420 and the refraction index of the second wavelength selecting unit 450 are adjusted, the lasing wavelength may be changed in a wavelength range from 1530 nm through 1570 nm.

In this manner, a single longitudinal mode semiconductor laser element such as the integrated laser element in this embodiment can cover the whole wavelength bandwidth for WDM communication (e.g., C-band (1.53 µm to 1.56 µm) or L-band (1.57 µm to 1.61 µm)). As a result, the wavelength of laser light is changeable over a wavelength bandwidth equal to or larger than 30 nm.

Control Method

Figure 15:
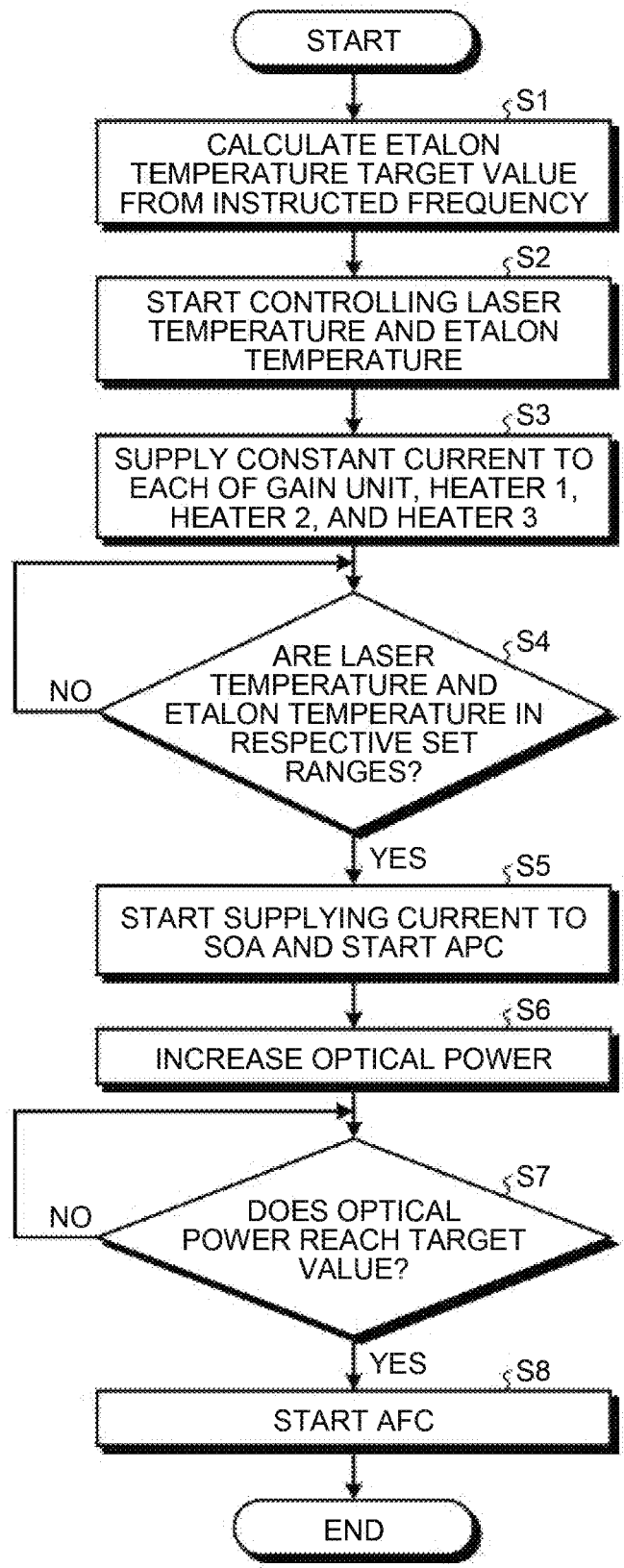
FIG. 15 is a schematic diagram illustrating an example of the whole flow of the control method of the wavelength tunable laser module.

The following describes the whole flow of a control method of the wavelength tunable laser module 100A with reference to FIG. 15. FIG. 15 is a schematic diagram illustrating an example of the whole flow of the control method of the wavelength tunable laser module.

As explained above, the memory 370 of the controller 300A stores, as initial values for each basic frequency channel, the data including a heater 1 current value, a heater 2 current value, a heater 3 current value, a gain unit current value, an SOA current value, a laser temperature, an etalon temperature, power monitor PD current values, a PD current ratio (=PD1/PD2) serving as a feedback control target value. The data is acquired by the wavelength calibration using a wavelength meter and recorded in the memory 370 prior to the shipment of the wavelength tunable light module.

In addition, in the memory 370 of the controller 300A, the data is stored that includes frequencies at five points and the respective temperatures of the wavelength filter 221 (the data of the frequency of the basic frequency channel and the temperature of the wavelength filter 221, and the data of the measured frequencies at the four additional measurement frequencies and the respective temperatures of the wavelength filter 221) for each basic frequency channel, for example. The data is acquired by the wavelength measurement using the wavelength meter and recorded in the memory 370 prior to the shipment of the wavelength tunable laser module.

At step S1, the controller 300A calculates the target value of the temperature of the wavelength filter 221 in accordance with the frequency instructed by the user via the higher-level controller. Specifically, the digital computing unit 360 of the controller 300A refers to the data of the set of the measured frequencies and the temperatures of the wavelength filter 221 at two or more points for each basic frequency channel, the data being stored in the memory 370, selects the basic frequency channel closest to the frequency of laser light instructed by the user to cause the integrated laser element 410 to emit, and calculates the temperature of the wavelength filter 221 for providing the instructed frequency of laser light from the data of the sets of the measured frequencies allocated to the basic frequency channel closest to the instructed frequency and the temperatures of the wavelength filter 221.

At step S2, controlling the temperatures of the integrated laser element 410 and the wavelength filter 221 starts.

The digital computing unit 360 of the controller 300A transmits the control signal to the etalon temperature control circuit 352 so as to cause the temperature of the wavelength filter 221 to reach the calculated target value, and starts monitoring the temperature of the wavelength filter 221 via the filter temperature monitoring element 223 and the etalon temperature monitoring circuit 351.

As a result, the discrimination curve corresponding to the frequency instructed by the user is obtained that is shifted from the discrimination curve of the wavelength filter 221 at the basic frequency channel in the wavelength direction, as illustrated in aforementioned FIG. 7 that illustrates an example of the shifting of the discrimination curve in the wavelength direction. In FIG. 7, the discrimination curve at the basic frequency channel is indicated with the broken line while the discrimination curve corresponding to the frequency instructed by the user is indicated with the solid line.

At step S3, constant currents defined by the basic frequency channel are started to be supplied to the gain unit 440, the heater 1, the heater 2, and the heater 3, respectively. Specifically, the digital computing unit 360 of the controller 300A transmits control signals to the gain unit current controlling circuit 380, the heater 1 controlling circuit 391, the heater 2 controlling circuit 392, and the heater 3 controlling circuit 393, respectively.

At step S4, the digital computing unit 360 of the controller 300A stands by until both of the temperatures of the integrated laser element 410 and the wavelength filter 221 are in respective set ranges. Specifically, the digital computing unit 360 of the controller 300A monitors temperature information from the laser temperature monitoring circuit 321 and the etalon temperature monitoring circuit 351 and determines whether the temperatures of the integrated laser element 410 and the wavelength filter 221 are in the respective set ranges.

If both of the temperatures of the integrated laser element 410 and the wavelength filter 221 are in the respective set ranges, supplying a current to the SOA 214 starts and auto power control (APC) starts at step S5. Specifically, the digital computing unit 360 of the controller 300A transmits the control signal to the SOA control circuit, and performs feedback control such that the current from the power monitor 240 reaches the target value stored in the memory

370 while monitoring the power of the integrated laser element 410 via the power monitor 240 and the PD1 current monitoring circuit 341.

As illustrated in FIG. 8, with an increase in current supplied to the SOA 214, the current output by the power monitor 240 is increased. FIG. 8 is a graph illustrating a relation between the current supplied to the SOA and the current output by the power monitor. At step S6 and step S7, the power of the integrated laser element 410 may be adjusted to the target value while the power of the integrated laser element 410 is increased and whether the power of the integrated laser element 410 reaches the target value is monitored using the relation illustrated in FIG. 8.

If the power of the integrated laser element 410 reaches the target value, auto frequency control (AFC) is performed at step S8. Specifically, the digital computing unit 360 of the controller 300A monitors the current (PD1) output from the power monitor 240 via the PD1 current monitoring circuit 341 and the current (PD2) output from the wavelength monitor 250 via the PD2 current monitoring circuit 342, and calculates the PD current ratio (PD2/PD1).

The digital computing unit 360 of the controller 300A performs feedback control such that the calculated PD current ratio becomes the PD current ratio stored in the memory 370 as the feedback control target value of the basic frequency channel on the basis of the discrimination curve illustrated in FIG. 9. FIG. 9 is a graph illustrating an exemplary discrimination curve that corresponds to the instructed frequency and is obtained by controlling the temperature of the wavelength filter 221 so as to become the etalon temperature target value obtained at step S1.

The discrimination curve used for the AFC at step S8 is obtained by shifting the discrimination curve at the basic frequency channel in the wavelength direction. The feedback control target value used for the AFC at step S8 may use the PD current ratio stored in the memory 370 as the feedback control target value of the basic frequency channel.

As a reflection element that generates a comb-shaped reflection spectrum of which optical characteristic is changed depending on a refraction index, a sampled grating distributed Bragg reflector (SG-DBR), a reflection mirror including a ring resonator filter, or the like may be used.

The embodiments to which the disclosure made by the inventor is applied have been described above. The description and the drawings, which partially constitute of the disclosure of the embodiments, however, do not limit the disclosure. In the first embodiment, the semiconductor laser elements formed in an array are used as the laser light source, and in the second embodiment, the integrated laser element utilizing a vernier effect is used as the laser light source. However, any types of semiconductor laser devices may be used as the laser light source. For example, a single DFB laser element or a general distributed Bragg reflector (DBR) laser element may be used as the laser light source. In this way, other embodiments, examples, and operation techniques carried out by the skilled person in the art on the basis of the embodiment are all included in the scope of the disclosure.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A method of controlling a wavelength of a wavelength tunable laser module, utilizing a vernier effect, that includes a laser light source that emits laser light, a wavelength filter having a periodic transmission characteristic with respect to a wavelength of light, and a controller that controls a wavelength of laser light emitted from the laser light source based on power of the laser light transmitted by the wavelength filter and controls the transmission characteristic of the wavelength filter, the method comprising:
    referring to data of measured frequencies and wavelength filter control values at two or more points for each basic frequency channel, the data being stored in a memory of the controller;
    selecting the basic frequency channel closest to a frequency of laser light that the laser light source is instructed to emit from a plurality of the basic frequency channels stored in the memory;
    calculating a first wavelength filter control value to provide the instructed frequency of laser light from the data of the measured frequencies allocated to the basic frequency channel closest to the instructed frequency and the wavelength filter control values; and
    controlling the transmission characteristic of the wavelength filter using the first wavelength filter control value,
    wherein the first wavelength filter control value is a temperature of the wavelength filter.

2. The method of controlling a wavelength of a wavelength tunable laser module utilizing the vernier effect according to claim 1, wherein, at the calculating of the first wavelength filter control value, the first wavelength filter control value is calculated by a linear approximation or a second or higher order polynomial approximation from the data of the measured frequencies interposing the instructed frequency therebetween and the wavelength filter control values.

3. The method of controlling a wavelength of a wavelength tunable laser module utilizing the vernier effect according to claim 1, wherein, at the calculating of the first wavelength filter control value, the first wavelength filter control value is calculated by a linear approximation or a second or higher order polynomial approximation from the data of the measured frequencies that do not interpose the instructed frequency therebetween and the wavelength filter control values.

4. The method of controlling a wavelength of a wavelength tunable laser module utilizing the vernier effect according to claim 1, wherein the data of the measured frequencies and the wavelength filter control values that are stored in the memory of the controller are preliminarily recorded in the memory as a result of additional measurement, the additional measurement being performed by dividing frequency spacing between adjacent basic frequency channels into n divisions and performing measurement on a frequency of at least one of (n−1) divided points of then divisions.

5. A wavelength tunable laser module, utilizing a vernier effect, comprising:
    a laser light source that emits laser light;
    a wavelength filter that has a periodic transmission characteristic with respect to a wavelength of light;
    a controller that controls a wavelength of laser light emitted from the laser light source based on power of the laser light transmitted by the wavelength filter and controls the transmission characteristic of the wavelength filter,
    wherein the controller includes a computing unit that is programmed so as to execute:

referring to data of measured frequencies and wavelength filter control values at two or more points for each basic frequency channel, the data being stored in a memory of the controller;

selecting the basic frequency channel closest to a frequency of laser light that the laser light source is instructed to emit from a plurality of the basic frequency channels stored in the memory;

calculating a first wavelength filter control value to provide the instructed frequency of laser light from the data of the measured frequencies allocated to the basic frequency channel closest to the instructed frequency and the wavelength filter control values; and controlling the transmission characteristic of the wavelength filter using the first wavelength filter control value, and wherein the first wavelength filter control value is a temperature of the wavelength filter.

6. A method of controlling a wavelength of a wavelength tunable laser module, utilizing a vernier effect, that includes a laser light source that emits laser light, a wavelength filter having a periodic transmission characteristic with respect to a wavelength of light, and a controller that controls a wavelength of laser light emitted from the laser light source based on power of the laser light transmitted by the wavelength filter and controls the transmission characteristic of the wavelength filter, the method comprising:

referring to data of measured frequencies and wavelength filter control values at two or more points for each basic frequency channel, the data being stored in a memory of the controller;

selecting the basic frequency channel closest to a frequency of laser light that the laser light source is instructed to emit from a plurality of the basic frequency channels stored in the memory;

calculating a first wavelength filter control value to provide the instructed frequency of laser light from the data of the measured frequencies allocated to the basic frequency channel closest to the instructed frequency and the wavelength filter control values;

selecting the basic frequency channel secondly closest to the frequency of laser light that the laser light source is instructed to emit from the plurality of the basic frequency channels stored in the memory;

calculating a second wavelength filter control value for providing the instructed frequency of laser light from the data of the measured frequencies allocated to the basic frequency channel secondly closest to the instructed frequency and the wavelength filter control values; and controlling the transmission characteristic of the wavelength filter using one closer to a center value of the wavelength filter control value stored in the memory out of the first wavelength control value and the second wavelength control value instead of the first wavelength control value, wherein the first wavelength filter control value and the second wavelength filter control value are temperatures of the wavelength filter.

7. The method of controlling a wavelength of a wavelength tunable laser module utilizing the vernier effect according to claim 6, wherein, at least one of the first wavelength filter control value and the second wavelength filter control value is calculated by a linear approximation or a second or higher order polynomial approximation from the data of the measured frequencies interposing the instructed frequency therebetween and the wavelength filter control values.

8. The method of controlling a wavelength of a wavelength tunable laser module utilizing the vernier effect according to claim 6, wherein, at least one of the first wavelength filter control value and the second wavelength filter control value is calculated by a linear approximation or a second or higher order polynomial approximation from the data of the measured frequencies that do not interpose the instructed frequency therebetween and the wavelength filter control values.

9. The method of controlling a wavelength of a wavelength tunable laser module utilizing the vernier effect according to claim 6, wherein the data of the measured frequencies and the wavelength filter control values that are stored in the memory of the controller are preliminarily recorded in the memory as a result of additional measurement, the additional measurement being performed by dividing frequency spacing between adjacent basic frequency channels into n divisions and performing measurement on a frequency of at least one of (n−1) divided points of then divisions.

10. A wavelength tunable laser module, utilizing a vernier effect, comprising:

a laser light source that emits laser light;

a wavelength filter that has a periodic transmission characteristic with respect to a wavelength of light;

a controller that controls a wavelength of laser light emitted from the laser light source base on power of the laser light transmitted by the wavelength filter and controls the transmission characteristic of the wavelength filter, wherein the controller includes a computing unit that is programmed so as to execute:

referring to data of measured frequencies and wavelength filter control values at two or more points for each basic frequency channel, the data being stored in a memory of the controller;

selecting the basic frequency channel closest to a frequency of the laser light that the laser light source is instructed to emit from a plurality of the basic frequency channels stored in the memory;

calculating a first wavelength filter control value to provide the instructed frequency of laser light from the data of the measured frequencies allocated to the basic frequency channel closest to the instructed frequency and the wavelength filter control values;

selecting the basic frequency channel secondly closest to the frequency of laser light that the laser light source is instructed to emit from the plurality of the basic frequency channels stored in the memory;

calculating a second wavelength filter control value to provide the instructed frequency of laser light from the data of the measured frequencies allocated to the basic frequency channel secondly closest to the instructed frequency and the wavelength filter control values; and controlling the transmission characteristic of the wavelength filter using one closer to a center value of the wavelength filter control value stored in the memory out of the first wavelength control value and the second wavelength control value instead of the first wavelength control value, wherein the first wavelength filter control value and the second wavelength filter control value are temperatures of the wavelength filter.

* * * * *